(12) United States Patent
Kadoya et al.

(10) Patent No.: US 11,913,992 B2
(45) Date of Patent: Feb. 27, 2024

(54) CURRENT MEASURING SYSTEM FOR MACHINE TOOL AND CURRENT MEASURING METHOD THEREOF

(71) Applicant: MAZIN Inc., Taito (JP)

(72) Inventors: Takanori Kadoya, Taito (JP); Yusuke Uchiyama, Taito (JP)

(73) Assignee: MAZIN Inc., Taito (JP)

( * ) Notice: Subject to any disclaimer, the term of this patent is extended or adjusted under 35 U.S.C. 154(b) by 0 days.

(21) Appl. No.: 17/521,866

(22) Filed: Nov. 9, 2021

(65) Prior Publication Data
US 2022/0187373 A1 Jun. 16, 2022

(30) Foreign Application Priority Data

Dec. 11, 2020 (JP) ................................. 2020-206369
Aug. 20, 2021 (JP) ................................. 2021-134609

(51) Int. Cl.
*G01R 31/34* (2020.01)
*B23Q 17/09* (2006.01)
*G01R 19/00* (2006.01)

(52) U.S. Cl.
CPC ....... *G01R 31/343* (2013.01); *B23Q 17/0961* (2013.01); *G01R 19/0092* (2013.01); *B23Q 2717/003* (2013.01)

(58) Field of Classification Search
CPC .............. G01R 31/343; G01R 19/0092; G01R 19/37252; G01R 19/37245; G01R 19/50203; B23Q 17/0961
See application file for complete search history.

(56) References Cited

U.S. PATENT DOCUMENTS

| 4,442,493 A * | 4/1984 | Wakai | G01N 3/58 |
| | | | 700/192 |
| 10,589,395 B2 * | 3/2020 | Kim | G08B 21/187 |
| 2004/0153259 A1 * | 8/2004 | Lee | B23Q 17/0961 |
| | | | 702/34 |

(Continued)

FOREIGN PATENT DOCUMENTS

| JP | 2006-82154 A | 3/2006 |
| JP | 2011-118840 A | 6/2011 |

(Continued)

OTHER PUBLICATIONS

Extended European Search Report dated Apr. 28, 2022.
Kief HB, "Das NC-Programm", NC/CNC Handbuch, Jan. 1, 1995, pp. 270-295.

*Primary Examiner* — Dominic E Hawkins
(74) *Attorney, Agent, or Firm* — Yokoi & Co., U.S.A.; Toshiyuki Yokoi

(57) ABSTRACT

A machine tool includes a first motor that receives load fluctuation when the workpiece is processed and a second motor that operates to change the plural kinds of tools. An information processing device takes out the current of the first motor measured by the first current sensor for each signal that occurs at the changing operation of the plural kinds of tools and is measured by the second current sensor, and relatively compares a non-negative function value that has a current value at each taken-out segment as a parameter for each number of times of processing on the workpiece, thereby detecting a tool abnormality for each kind of the tool.

6 Claims, 16 Drawing Sheets

(56) References Cited

U.S. PATENT DOCUMENTS

| | | | | |
|---|---|---|---|---|
| 2004/0193307 A1* | 9/2004 | Fujishima | .......... | G05B 23/0283 |
| | | | | 700/169 |
| 2014/0257717 A1* | 9/2014 | Kumazaki | .......... | B23Q 17/0961 |
| | | | | 702/35 |
| 2015/0160646 A1* | 6/2015 | Ward | .................. | G05B 19/401 |
| | | | | 700/178 |
| 2020/0398398 A1* | 12/2020 | Takasu | ............... | G05B 19/4065 |

FOREIGN PATENT DOCUMENTS

| JP | 2019-30954 A | 2/2019 |
|---|---|---|
| JP | 6637689 B | 1/2020 |

\* cited by examiner

CURRENT MEASURING SYSTEM FOR MACHINE TOOL AND CURRENT MEASURING METHOD THEREOF

CROSS-REFERENCES TO RELATED APPLICATIONS

This patent specification is based on Japanese patent application, No. 2020-064307 filed on Dec. 11, 2020 in the Japan Patent Office and Japanese patent application, No. 2021-134609 filed on Aug. 20, 2021 in the Japan Patent Office, the entire contents of which are incorporated by reference herein.

BACKGROUND OF THE INVENTION

1. Field of the Invention

The present disclosure relates to a technology for measuring a current that flows through a motor of a machine tool which performs processing by cutting tool.

2. Description of the Related Art

Measuring technologies using various sensors have been developed for the purpose of accomplishing an intelligence machine tool that performs processing by cutting tool (also referred to as "tool" below in some cases). Especially, measurement of a current that flows through a motor of the machine tool is conventionally carried out since it is low cost and is easy to handle. By estimating a load on the tool from the measured current value of the motor, the progress of wear of the tool is estimated. Moreover, it is attempted to estimate abnormal phenomena, such as a fracture of the tool and a chipping thereof, based on an instant keen change in the current value of the motor.

Conventionally, in a machine tool that performs cutting work by a relative motion between a workpiece (a material to be cut) that is an object subjected to processing and the tool, by repeatedly utilizing the same tool, the wear of such a tool progress, and the tool is eventually chipped or damaged. Hence, for the tool utilized by the machine tool, although the number of times of processing (counted as one time every time one object subjected to processing is processed) that is an indication of the replacement (replacement with the same kind of new tool) recommended by a tool manufacturer is set, since the optimal tool replacement cycle differs depending on the processing method and on the object to be processed, there is a desire to estimate the optimal tool replacement cycle based on a load applied to the tool during the cutting work.

A technology is disclosed (see Patent Document 1) which detects the load on the rotating main shaft to which a tool is attached by a preset number of times of rotation, and which determines the wear of the tool of an NC (Numerical Control) machine tool under a condition in which the average value of the main shaft load and the rotation frequency component continuously become a constant value.

Moreover, a technology is disclosed (see Patent Document 2) which determines the wear of a tool by comparing the preset effective power waveform of a motor which drives a main shaft with the effective power waveform of the motor that drives the main shaft which is processing a workpiece.

Furthermore, a technology is disclosed (see Patent Document 3) which detects a state in which a tool attached to a rotating main shaft is in contact with a workpiece, and which detects the wear level of the tool by utilizing a change level of a tool load applied to the main shaft in contact with such a workpiece.

Patent Document 1: Japan Patent No. 6637689
Patent Document 2: JP 2006-82154 A
Patent Document 3: JP 2019-30954 A According to the method disclosed in Patent Document 1, however, since it is necessary to utilize frequency information on time-series data collected by an acceleration sensor, it is difficult to apply such a technology to time-series data collected by a current sensor.

Moreover, regarding the application to cutting work that utilizes a plurality of tools, it is difficult to make a determination for each tool. Hence, the application of such a technology as it is to processing performed at an actual production site is difficult.

Regarding the method disclosed in Patent Document 2, similarly, since no method for make a determination for each tool is not disclosed or suggested for processing that utilizes plural kinds of tools, this technology is effective for processing that utilizes a single tool but cannot be applied as it is to processing that utilizes plural kinds of tools.

According to the method disclosed in Patent Document 3, although such a technology is applicable to processing that utilizes plural kinds of tools by connecting an external device to an NC machine of a machine tool to obtain tool change information, the connection of the external device to the NC machine may be regarded as a reconstruction of the machine tool from the standpoint of a machine-tool manufacturer. Hence, such a technology is hardly adopted in actual cutting work sites.

An objective of the present disclosure is to provide a technology that detects, in cutting work, etc., that utilizes plural kinds of tools by a machine tool which is performed at an actual production site, a tool abnormality occurring on a utilized tool without a connection of an external device to an NC machine.

BRIEF SUMMARY OF THE INVENTION

A current measuring system for a machine tool according to the present disclosure is a current measuring system that includes a first current sensor and a second current sensor each connected to an information processing device,
  in which the machine tool that processes a workpiece while changing plural kinds of tools includes:
  a first motor that receives load fluctuation when the workpiece is processed; and
  a second motor that operates to change the plural kinds of tools, and
  in which the information processing device performs a process of overlapping a time-history waveform of a current which flows through the first motor and which is measured by the first current sensor with a time-history waveform of a current which flows through the second motor and which is measured by the second current sensor in such a way that respective elapsed times match with each other, takes out the current of the first motor measured by the first current sensor for each signal that occurs at the changing operation of the plural kinds of tools in an analysis process, and relatively compares a non-negative function value that has a current value at each taken-out segment as a parameter for each number of times of processing on the workpiece, thereby detecting a tool abnormality for each kind of the tool.

The first motor that receives load fluctuation when the workpiece is processed may include a motor for rotating and driving the workpiece around a main shaft. An example main shaft is the main shaft of an NC lathe.

The first motor may be to drive a positioning device of the workpiece. An example positioning device is the stage of a machining center.

The first motor may be to drive a member when a position of the member to which the tool is attached is changed. An example member is the main shaft of a machining center or the tool stage of an NC lathe. Changing the position of the member means a movement of the main shat of the machining center in the Z-axis direction or a movement of the tool stage of the NC lathe in the Z-axis direction and in the X-axis direction.

The first motor may be to rotate and drive the tool around a main shaft. An example main shaft is the main shaft of the machining center.

According to the present disclosure, a current measuring method is for a machine tool which includes a first motor that receives load fluctuation when a workpiece is processed, and a second motor that operates to change plural kinds of tools and which processes the workpiece while changing the plural kinds of tools, and the current measuring method includes:

causing an information processing device to which a first current sensor and a second current sensor are connected to perform a process of overlapping a time-history waveform of a current which flows through the first motor and which is measured by the first current sensor with a time-history waveform of a current which flows through the second motor and which is measured by the second current sensor in such a way that respective elapsed times match with each other; and causing the information processing device to perform a process of taking out the current of the first motor measured by the first current sensor for each signal that occurs at the changing operation of the plural kinds of tools in an analysis process, and relatively comparing a non-negative function value that has a current value at each taken-out segment as a parameter for each number of times of processing on the workpiece, thereby detecting a tool abnormality for each kind of the tool.

According to the present disclosure, a technology capable of detecting an abnormality of a tool that is being utilized in processing by a machine tool that utilizes the plural kinds of tools.

DETAILED DESCRIPTION OF THE INVENTION

A current measuring system for a machine tool according to a first embodiment of the present disclosure will be described below in detail with reference to the accompanying drawings.

It is assumed that a machine tool is an NC lathe.

Figure 1:
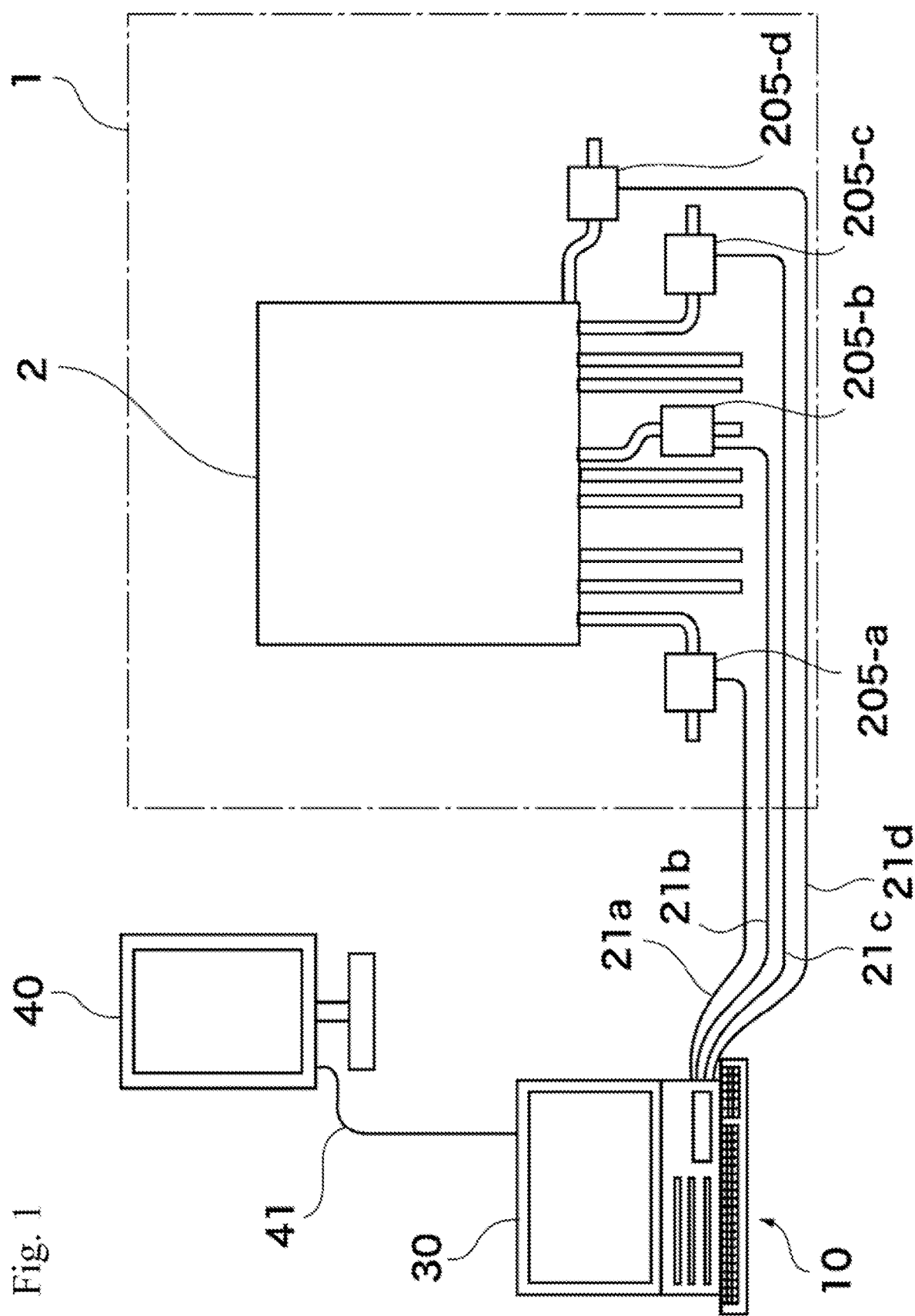
FIG. 1 is a configuration diagram of a current measuring system for a machine tool according to a first embodiment of the present disclosure.

FIG. 1 is a block diagram of a current measuring system 10 for a machine tool 1 according to this embodiment of the present disclosure.

The current measuring systems 10 includes a current sensor 205-*a*, a current sensor 205-*b*, a current sensor 205-*c*, and a current sensor 205-*d*, a cable 21-*a*, a cable 21-*b*, a cable 21-*c*, and a cable 21-*d*, an information processing device (e.g., an industrial personal computer) 30, and a display device 40.

The current sensors 205 are each, for example, a well-known magnetic current sensor, and each measure a current value (an amount of current) by causing a magnetic sensor to detect magnetic fields generated by a current to be measured around a cable, and by measuring the magnitude of the magnetic fields. Among the cables extended from a control board 2 of the machine tool 1, the current sensor 205-*a* is attached to the cable (wiring) connected to a main shaft motor 101 in order to measure a current that flows through the main shaft motor 101, the current sensor 205-*b* is attached to the cable connected to a servo motor 102-*a* (a Z-axis servo motor that drives a tool mount 106) in order to measure a current that flows through the servo motor 102-*a*, a current sensor 205-*c* is attached to the cable connected to a servo motor 102-*b* (an X-axis servo motor that drives the tool mount 106) in order to measure a current that flows through the servo motor 102-*b*, and a current sensor 205-*d* is attached to the cable connected to a servo motor 102-*c* (a tool mount rotating servo motor) in order to measure a current that flows through the servo motor 102-*c*.

The cable 21-*a*, the cable 21-*b*, the cable 21-*c*, and the cable 21-*d* of the current sensor 205-*a*, the current sensor 205-*b*, the current sensor 205-*c*, and the current sensor 205-*d*, respectively, are connected (e.g., wireless connection) to the information processing device 30. Note that each cable 21 is connected to an unillustrated I/O module (including an analog electronic circuit for noise elimination and for signal amplification, and an AD converter for converting analog data into digital data). The I/O module converts an analog signal input from the current sensor 205 into a digital signal, and the digital signal may be output to the information processing device 30 by a wired or wireless communication.

The information processing device 30 includes a CPU, etc., that is an arithmetic processing unit as a control unit and also a calculation unit, and further includes a predetermined storage device as a storing unit in the form of a built-in or an external HDD, etc. Moreover, the information processing device 30 may include a built-in electronic circuit as an analog circuit.

The display device 40 includes a display mechanism and an input mechanism, and may be supported by a predetermined stand, or fixed to the machine tool 1 by a predetermined jig. Moreover, the display device 40 may only have an informing function simply like a lamp. The display device 40 is connected to the information processing device 30 by a predetermined cable 41 (or may be connected wirelessly). An example display device 40 is a liquid crystal display, a touch-panel display, a tablet terminal, or a smart phone, etc.

Figure 2:
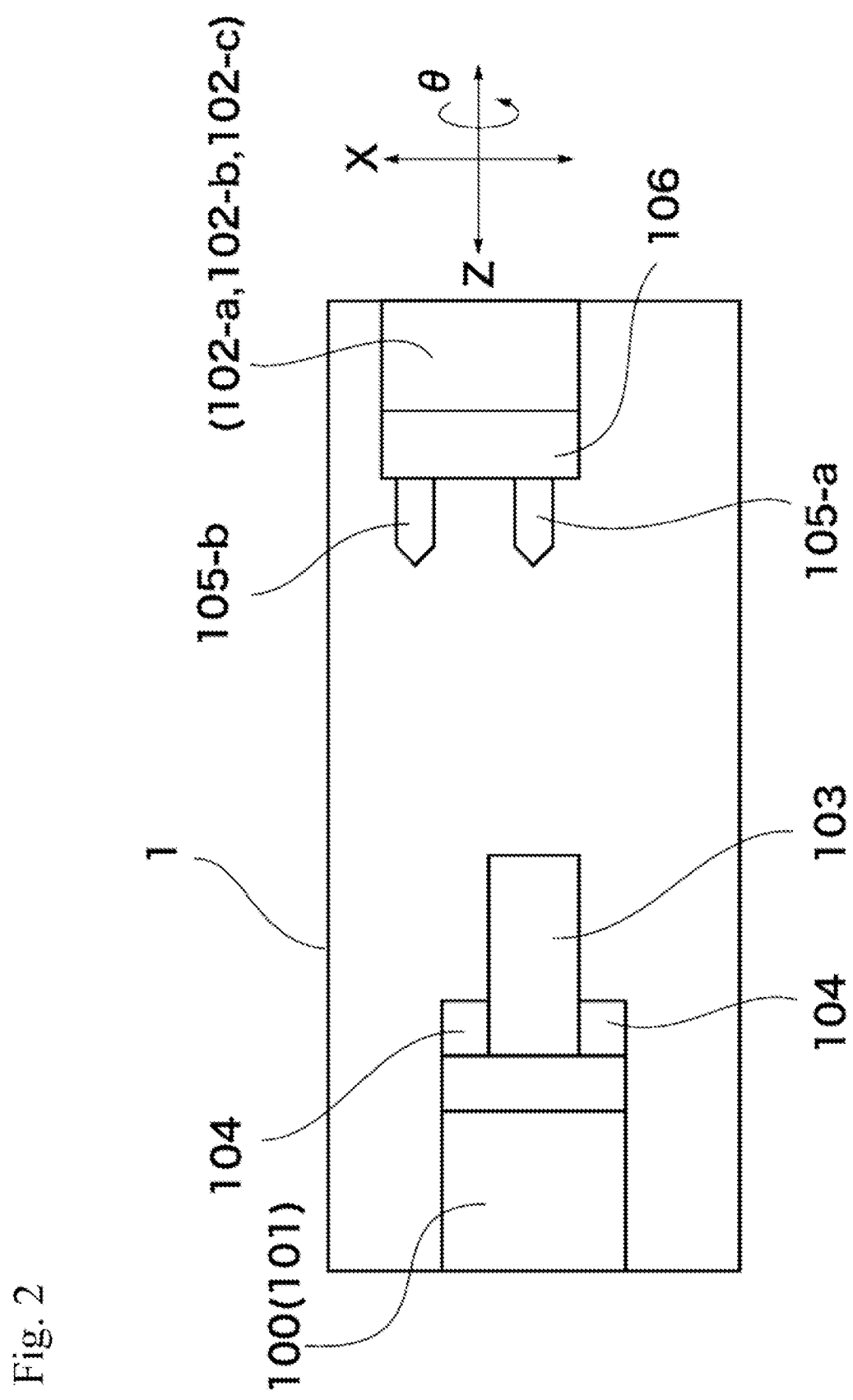
FIG. 2 is a schematic diagram of the machine tool according to the first embodiment of the present disclosure.

FIG. 2 is a schematic diagram illustrating an example well-known "NC lathe" as the machine tool 1.

Attached to the machine tool 1 are the main shaft motor 101 that drives the main shaft 100, and the servo motor 102-*a*, the servo motor 102-*b* and the servo motor 102-*c* which drive the tool mount (a tool exchanging device) 106.

A workpiece 103 to be processed (e.g., a metal round bar) is fastened by a chuck 104 attached to the main shaft 100, and is rotated around the main shaft 100.

Plural kinds of tools 105-*a* and 105-*b* (in this example, two that are a and b for the purpose of simplification of description, but it may be equal to or greater than three) for processing a workpiece are attached and fixed to the tool mount (the tool exchanging device) 106. Note that the servo motor 102-*a* (the Z-axis servo motor), the servo motor 102-*b* (the X-axis servo motor), and the servo motor 102-*c* (the tool mount rotating servo motor) which drive the tool mount 106 serve for, in FIG. 1, a movement in the horizontal direction indicated by a Z-axis, a movement in the vertical direction indicated by an X-axis, and a rotation (to change the tools 105-*a* and 105-*b* by a rotation of the tool mount 106) around the horizontal direction (Z-axis) indicated by □. Depending on the machine tool, the degree of freedom for movability by the servo motor 102 may further increase, and a motor for such a purpose may be further added.

In FIG. 1, the tool mount 106 and the tool 105-*a* are moved forward toward the left side in the figure by the servo motor 102-*a* (the Z-axis servo motor) in accordance with a command from an NC program, and the tool 105-*a* abuts the workpiece 103 (which is rotating around the main shaft) so as to perform a cutting work, etc.

When the tool is changed to the tool 105-*b* from the tool 105-*a*, in FIG. 1, the tool mount 106 and the tool 105-*a* are retracted to the right side in the figure, the tool mount 106 is rotated by the servo motor 102-*c* (the tool mount rotating servo motor), and the position of the tool 105-*a* and that of the tool 105-*b* are changed. Hence, the tool is changed (Note that the description will be given based on the condition in which a "change" to a different kind of a tool, and an "exchange (to a new one)" of a tool are different actions).

Hence, in FIG. 1, when the tool mount 106 and the tool 105-*b* are moved forward to the left side in the figure by the servo motor 102-*a* (the Z-axis servo motor), the tool 105-*b* abuts the workpiece 103 (which is rotating around the main shaft).

The tool 105 is selected in accordance with the material of the workpiece 103 and with the kind of processing, and in the case of, for example, crude processing in which it is required to take a remove volume as many as possible per a unit processing time, a tool in a shape that increases a contact volume between the workpiece 103 and the tip of the tool 105 is selected, and in the case of finish processing for a surface that directly influences on the processing quality, the tool 105 that has a tip shape which equalizes the surface roughness is selected. Furthermore, in the case of inner diameter cutting work for cutting the workpiece 103 from the internal side of the rotation shaft, the tool 105 for boring is selected.

Figure 3:
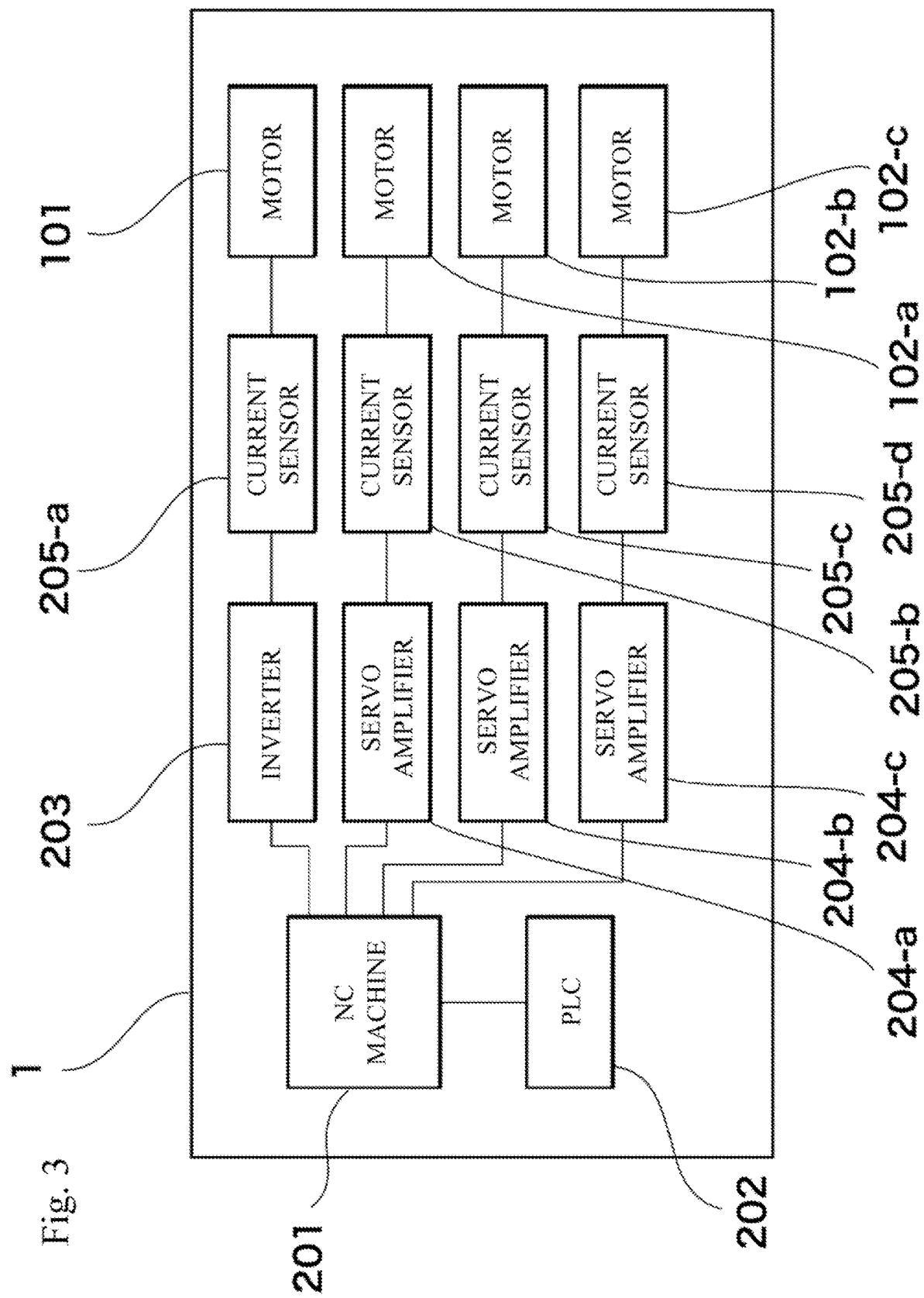
FIG. 3 is a block diagram for describing a signal flow according to the first embodiment of the present disclosure.

FIG. 3 is a block diagram for describing a signal flow on an NC lathe that is the machine tool 1, and on the current measuring system 10.

In FIG. 3, first, a control signal output by an NC machine 201 is input to a PLC 202, an inverter 203, a servo amplifier 204-*a*, a servo amplifier 204-*b*, and a servo amplifier 204-*c*.

The inverter 203 drives the main shaft motor 101, and the servo amplifier 204-*a*, the servo amplifier 204-*b* and the servo amplifier 204-*c* control the respective operations (actuations) of the servo motor 102-*a*, the servo motor 102-*b*, and the servo motor 102-*c* in accordance with commands from the NC machine 201.

The current sensor 205-*a* measures a current that flows through the main shaft motor 101, and the current sensor 205-*b*, the current sensor 205-*c*, and the current sensor 205-*d* measure respective currents that flow through the servo motor 102-*a*, the servo motor 102-*b*, and the servo motor 102-*c*.

A program (an NC program) for processing the workpiece 103 into a desired shape is loaded in advance in the NC machine 201.

When the main shaft motor 101 rotates, the workpiece 103 fastened by the chuck 104 also rotates simultaneously.

The servo amplifier 204-*a* drives the servo motor 102-*a* in accordance with a command from the NC machine 201, and thus the tool mount 106 moves in the horizontal direction indicated as the Z-axis in FIG. 2. Hence, the tool 105 contacts the workpiece 103, and a cutting work is performed thereon.

The servo amplifier 204-*b* drives the servo motor 102-*b* in accordance with a command from the NC machine 201, and thus the tool mount 106 moves in the vertical direction indicated as the X-axis in FIG. 2.

The servo amplifier 204-*c* controls the servo motor 102-*c* so as to rotate the tool mount 106 in accordance with a command from the NC machine 201, the tool 105 that contacts the workpiece 103 is replaced.

Figure 4:
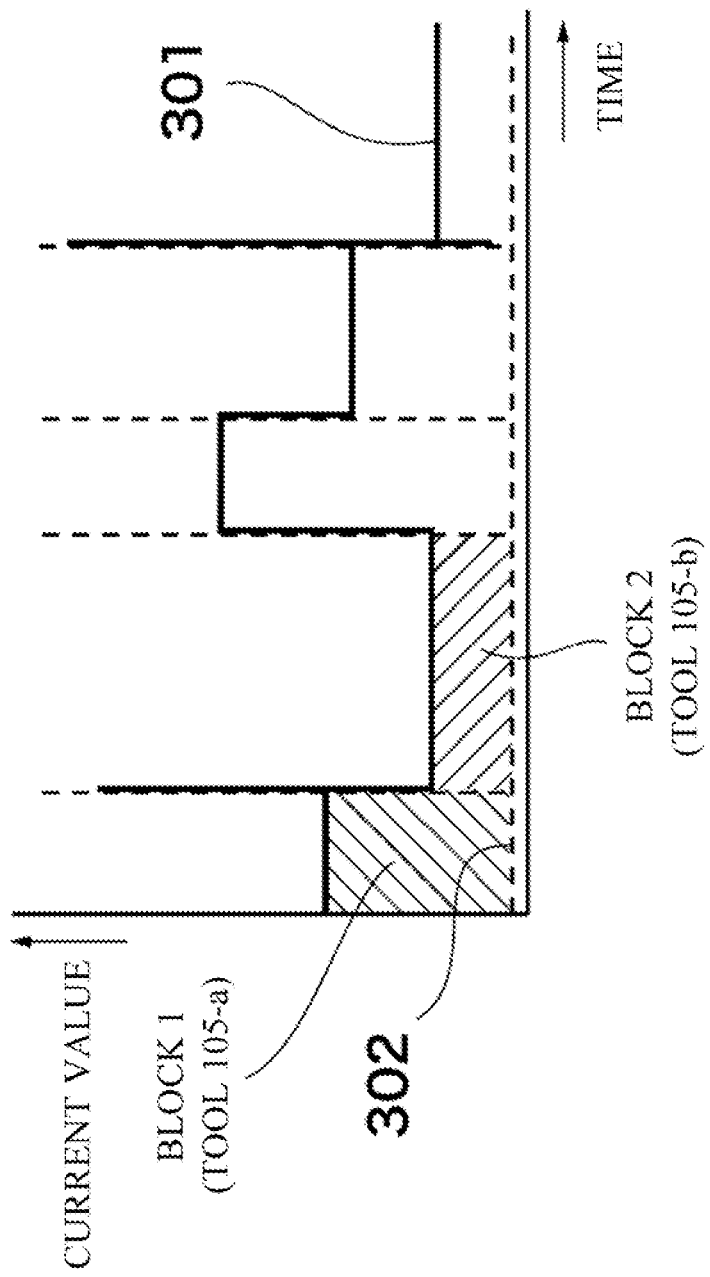
FIG. 4 is a diagram illustrating time-history waveforms of a current signal that flows through a main shaft motor and of a current signal that flows through a servo motor according to the first embodiment of the present disclosure.

FIG. 4 illustrates a time-history waveform 301 (indicated by a continuous line) of a current which is measured by the current sensor 205-*a* and which flows through the main shaft motor 101 while the NC lathe that is the machine tool 1 is operating, and a time-history waveform 302 (indicated by a dotted line) of a current which is measured by the current sensor 205-*d* and which flows through the servo motor 102-*c* (the tool mount rotating servo motor) while the machine tool 1 is operating. Note that the vertical axis represents a current value, and the horizontal axis represents an elapsed time. Although the current sensor 205-*a* that measures a current which flows through the main shaft motor 101 will be described as an example that is a first current sensor, the current sensor 205-*b* that measures a current which flows through the servo motor 102-*a* (the Z-axis servo motor), and the current sensor 205-*c* that measures a current which flows through the servo motor 102-*b* (the X-axis servo motor) may be also adopted as the first current sensor, and thus the redundant description thereof will be omitted (note that the description for the current sensor 205-*b* that measure a current which flows through the servo motor 102-*a* (the Z-axis servo motor), and the current sensor 205-*c* that measures a current which flows through the servo motor 102-*b* (the X-axis servo motor) in the description with reference to FIG. 5 and FIG. 6 to be described later is redundant, and thus such description will be omitted).

When the tool applied for a cutting work, etc., is changed from the tool 105-*a* to the tool 105-*b* or is changed from the tool 105-*b* to the tool 105-*a*, the tool mount 106 is rotated. At this time, since a large current to rotate the tool mount 106 flows through the servo motor 102-*c*, a momentary peak appears in the time-history waveform 302 of the current that flows through the servo motor 102-*c*. By synchronizing (overlapping) the time-history waveform 302 that includes such a momentary peak with the time-history waveform 301 of the current that flows through the main shaft motor 101, the time-history waveform of the current that flows through the main shaft motor 101 in accordance with the hour of utilization of the tool 105-*a* and of the tool 105-*b* can be extracted (taken out).

The measured current value may be stored in the storage device, etc., of the information processing device 30, and the arithmetic processing unit of the information processing device 30 connected to such a storage device, etc., may perform a synchronization process on digital data, or the analog circuit (an electronic circuit that handles electrical signals which change continuously) of the information processing device 30 may perform a synchronization process on analog information.

More specifically, as illustrated in FIG. 4, it can be estimated that the tool 105-*a* is utilized up to the momentary peak that initially appears in the time-history waveform 302 from a time point at which a cutting work, etc., is started, the momentary peak initially appears when the tool mount 106 is rotated at first, and at this time point, the tool is changed to the tool 105-*b* from the tool 105-*a*, and subsequently, the tool 105-*b* is being utilized until the next momentary peak appears in the time-history waveform 302. However, FIG. 4 merely illustrates an example graph to facilitate understanding to the present disclosure, such an illustration ignores a state until the tool 105-*a* contacts the workpiece 103 from the time point at which the cutting work, etc., is started, and also a state in which no tool 105 contacts the workpiece 103 when the tool is changed to the tool 105-*b* from the tool 105-*a*. Moreover, the current value does not always take a constant (flat) value for each tool.

Note that when the cutting work, etc., is performed, by an association with data which is on the sequential order of the plurality of tools to be utilized and which is set in advance in a predetermined table, etc., of the storage device of the information processing device 30, every time the momentary peak appears in the time-history waveform 302, a change from the first utilized tool to the second utilized tool can be identified, and it is also specifically identifiable from what kind of tool the tools are changed. The data on the sequential order of the plurality of tools to be utilized may be obtained from the information processing device 30, and such data may be associated with the data illustrated in FIG. 4, and the display device 40 may display a tool name specifically indicating at what time slot the tool is utilized and the kind of such a tool.

Moreover, in FIG. 4, although the "NC lathe" that employs a predetermined structure is described as an example of the machine tool 1, such a specific structure is not limited to any particular structure as far as the machine tool 1 processes the workpiece 103 while changing the plural kinds of tools 105, and includes the first motor that receives load fluctuation when the workpiece 103 is processed, and the second motor for a changing operation of the plural kinds of tools 105. The first current sensor (e.g., the current sensor 205-*a*, the current sensor 205-*b* or the current sensor 205-*c*) measures a current that flows through the first motor that receives load fluctuation when the workpiece 103 is processed, the second current sensor that is the current sensor 205-*d* measures the current that flows through the second motor for a changing operation of the plural kinds of tools 105, the time-history waveforms of the respective currents of the two motors are synchronized with each other. This enables the analysis process (note that the same is true of the description with reference to FIG. 5 and FIG. 6 to be described later).

For example, in the case of the machine tool 1 that has the tool 105 stored in a box with a lid, etc., when the lid is opened by a predetermined motor, and when a large current (a momentary peak) at which the lid is opened and closed when the tool 105 is selected by a predetermined arm and is grasped is measured, the timing of changing the plural kinds of tools 105 can be estimated.

Furthermore, in addition to the estimation for the timing of replacing the tool 105, since large currents flow through the servo motor 102-*a* and the servo motor 102-*b* when the tool mount 106 is moved horizontally and vertically, the operating hour and operating rate, etc., of the machine tool 1 can be estimated based on such vertical and horizontal movements.

Still further, it can be also applicable for malfunction prediction (an abnormality detection). That is, the first current sensor that is the current sensor 205-*a* measures a current which flows through the first motor that drives the workpiece-103 side, the second current sensor that is the current sensor 205-*d* measures a current which flows through the second motor that drives the tool-105 side, and the respective time-history waveforms of the currents which flow through the two motors are synchronized to perform the analysis process. When a different waveform from a normal (normally operating time) waveform appears, it is estimated that this is a sign of the malfunction of the machine tool 1 or the tool 105, or, the machine tool or the tool is malfunction. This enables the malfunction prediction.

Figure 5A:
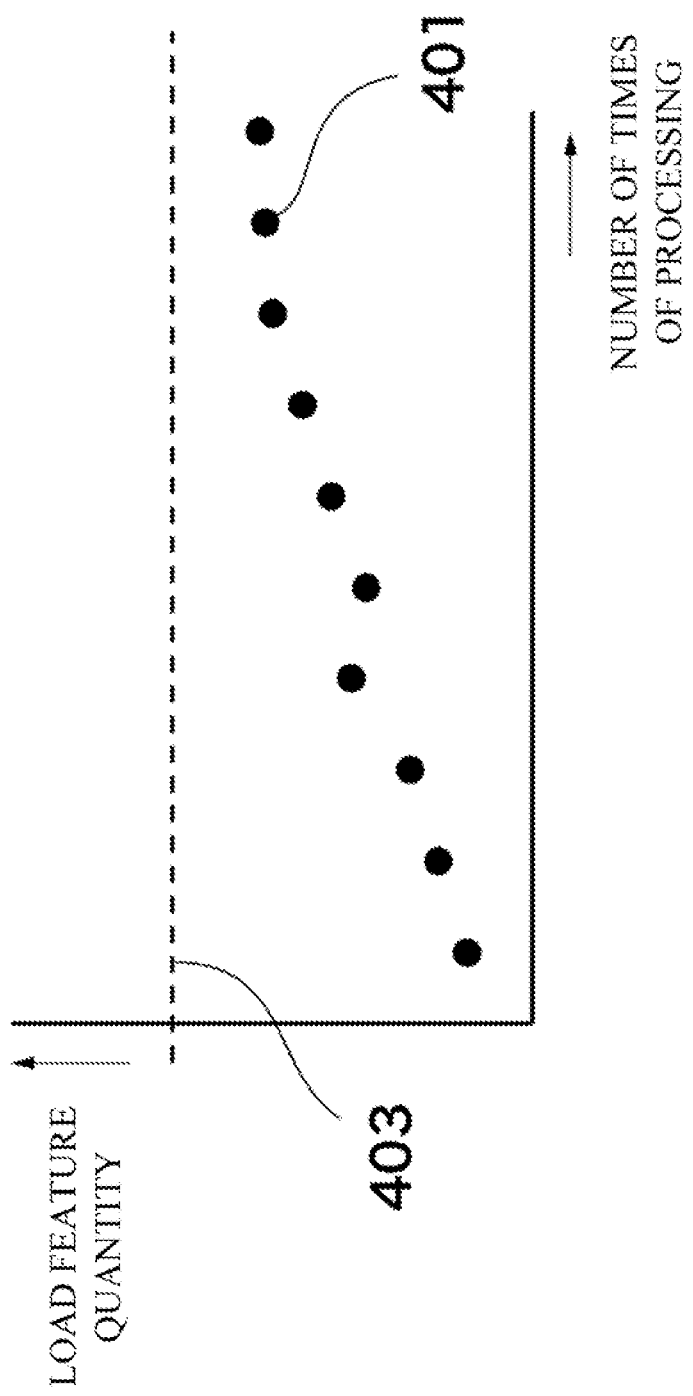
FIGS. 5A and 5B are each a diagram for describing a transition in a load feature quantity for each kind of tools according to the first embodiment of the present disclosure.
Figure 5B:
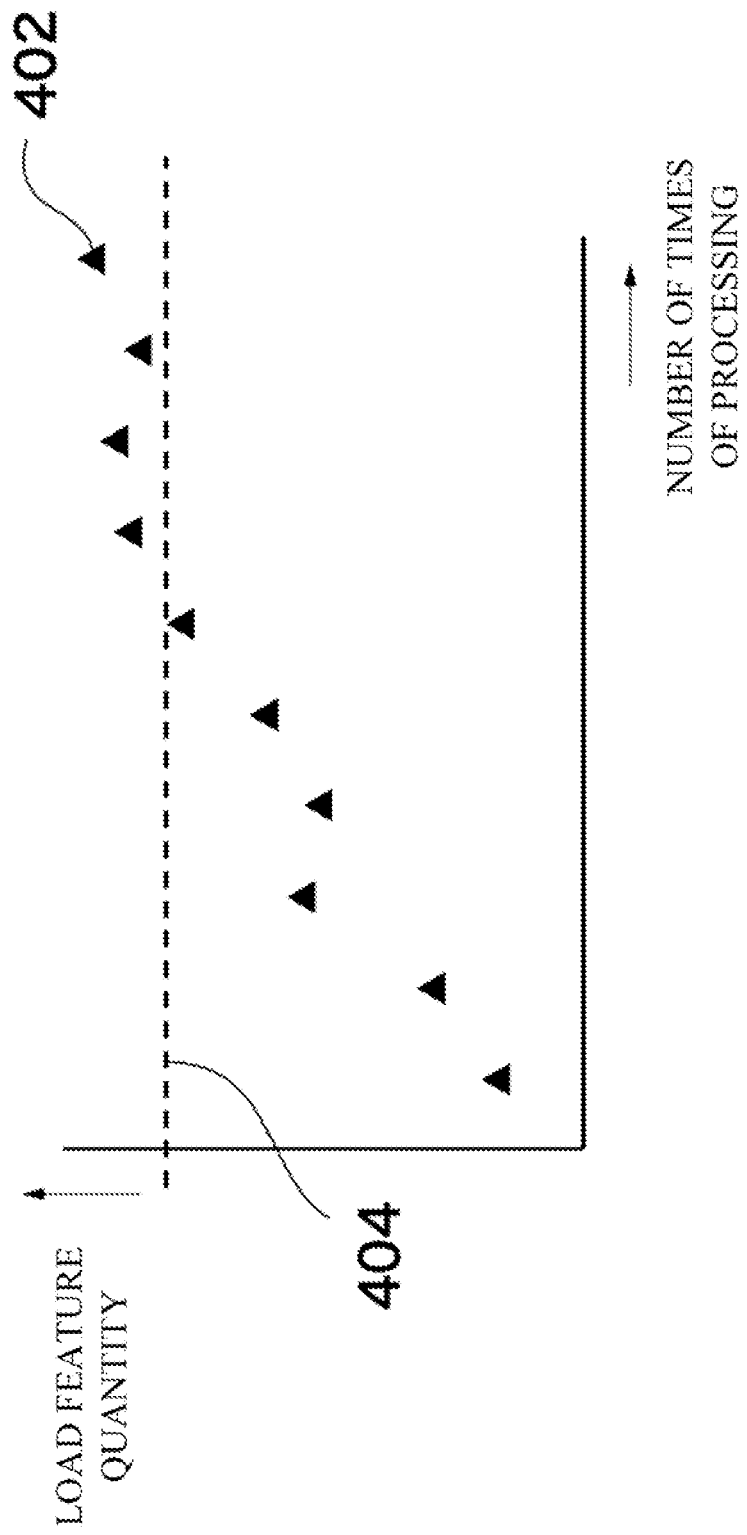

FIG. 5A and FIG. 5B illustrate transitions in a load feature quantity (note that the term "load" in this example means the magnitude of repulsive force when a tool is caused to contact the workpiece; there are various calculation formulae and indices, but in the following description, it is assumed that the load is estimated by measuring the "magnitude of the current", i.e., when relatively large load is applied (e.g., a an inferior tool contacts the workpiece, and resistance by what corresponds to such a contact occurs), a relatively large current flows, and when relatively small load is applied (e.g., not an inferior tool contacts the workpiece, and resistance by what corresponds to such a contact occurs), a relatively small current flows, and when no load is applied (idling), substantially no current flows, and such events are utilized for estimation) for each kind of the tool relative to the number of times of processing (may be a processing time or an eliminating volume, etc.).

In this embodiment, the term load feature quantity means the average value of a current value at each block in FIG. 4. More specifically, in FIG. 4, the magnitude of a current at a time at which the tool 105-*a* is utilized is indicated as a region (a taken-out segment) in a block 1, and the average value of the magnitudes of the current at such a time slot is plotted as a circle in FIG. 5A as the load feature quantity. Similarly, in FIG. 4, the magnitude of a current at a time at which the tool 105-*b* is utilized is indicated as a region (a taken-out segment) in a block 2, and the average value of the magnitudes of the current at such a time slot is plotted as a triangle in FIG. 5B as the load feature quantity. Note that the circle and the triangle plotted in FIGS. 5A and 5B are respective load feature quantities calculated by the arithmetic processing unit of the information processing device 30 based on a presumption such that the same workpieces are processed at the same conditions, such as a case in which the same products are produced by 100, and are indicated by graphs in order to facilitate understanding. Hence, making a graph is not essential.

In accordance with the increase in the number of times of processing, a load feature quantity 401 of the tool 105-*a* illustrated in FIG. 5A and a load feature quantity 402 of the tool 105-*b* illustrated in FIG. 5B both show an increase tendency (since there may be an error in measurement, etc., it is not always true that the load feature quantity increases in proportion to the number of times of processing).

This is because, when the surface of the tool is worn out and is deteriorated in accordance with the increase in the number of times of processing, i.e., the number of times of utilization of the tool, the friction of the surface of the tool that contacts the workpiece increases, i.e., a resistance increases and thus a load increases.

When it is determined that the load feature quantities of the respective tools calculated by the arithmetic processing unit of the information processing device 30 reach threshold 403 and threshold 404, respectively, of the respective load feature quantities of the tool set in advance in a predetermined table, etc., in the storage device of the information processing device 30 (any measurement error countermeasure such as to determine whether or not such feature quantity reaches continuously twice continuously even if it has reached once, and an additional condition such that it reaches continuously twice to a pre-threshold that is roughly 90 percentage may be added), it is estimated that the surface of the tool is worn out and the deterioration is remarkable, and thus the tool replacement cycle is coming, and the arithmetic processing unit of the information processing device 30 gives a predetermined alert for tool replacement on a display screen 5, etc., of the display device 40.

Note that although a non-negative function (a mean square value) that has the current value at each taken-out segment as a parameter is relatively compared for each number of times of processing of the object to be processed in the above case, the total value of the absolute values of the current values measured as the non-negative function values may be utilized.

Furthermore, when a theoretical lifetime curve (that indicates the progress of wear of the tool 105 under an ideal condition in which no variable due to disturbance, etc., occurs on a cutting work) is indicated in FIGS. 5A and 5B, based on the relation between the plotted load feature quantity and the theoretical lifetime curve (e.g., a transition, a tendency of inclination), the progress of wear of the tool 105 at the time of observation can be estimated by various conventional techniques. When, for example, the theoretical lifetime curve is substantially S-shape, a timing at which it comes to the second curve may be defined in advance as a tool replacement cycle, and when the information processing device 30 determines that it comes to the second curve based on the transition of the plotted load feature quantities, a predetermined alert for tool replacement may be given to the display screen 5, etc., of the display device 40.

Moreover, depending on the conditions, etc., of the processing, regarding the predetermined tool 105, since the sensitivity is low (e.g., the correspondence between the worn-out level of the tool and the change in current value is not excellent) for the current that flows through the main shaft motor 101 which is the first motor that receives load fluctuation when the workpiece 103 is processed, there may be a possibility such that it is difficult to effectively and efficiently estimate the progress of the wear of the tool. In such a case, the estimation may be possible from the current that flows through the other servo motor 102. Accordingly, the presence of the plurality of candidates as the first current sensor (e.g., the current sensor 205-*a*, the current sensor 205-*b*, and the current sensor 205-*c*) has a remarkable advantage in this point.

Figure 6:
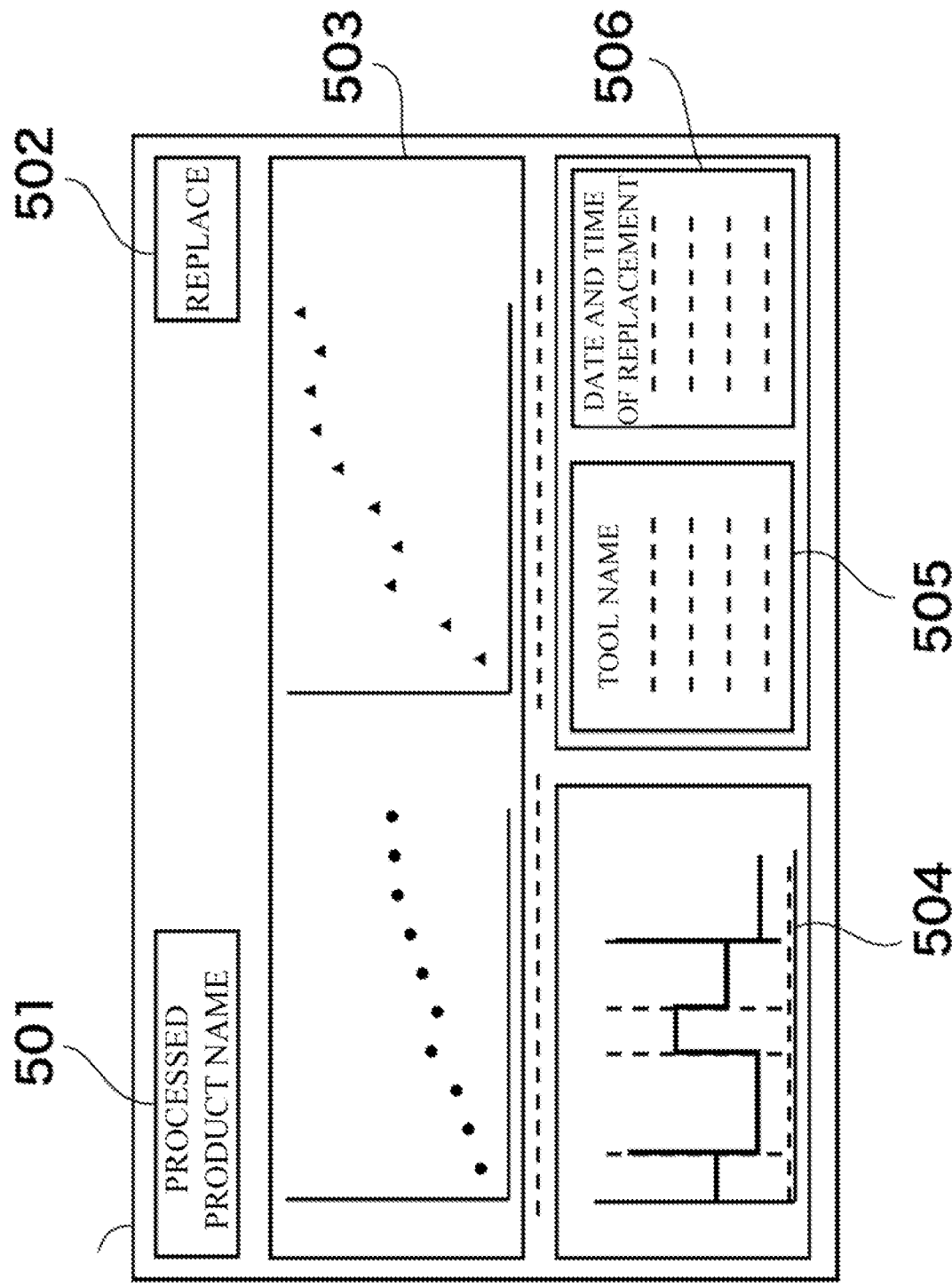
FIG. 6 is a diagram illustrating an example display screen on a display device according to the first embodiment of the present disclosure.

FIG. 6 illustrates an example display screen 5 displayed on the display device 40.

The display screen 5 includes a display 501 for a processed product name (e.g., product name: cam shaft for a vehicle of company A), a display 502 for a tool replacement notification (an alert), a display 503 for the tool load feature quantity, a display 504 for a current measured value (the time-history waveform of the current and the current value at the present time may be also displayed), a display 505 for the name of a tool, and a display 506 for a tool replacement record (e.g., the date and time of replacement) as past record information, etc. Needless to say, it is not necessary to display all of those.

Note that instead of an output on the display screen 5, a predetermined individual lamp, etc., may be turned on so as to give an alert for the tool replacement only.

Moreover, the data output to display device 40, etc., may be displayed only on a predetermined display unit (a liquid crystal display, etc.,) of the information processing device 30 so as to be utilized without being output to display device 40, etc.

Figure 7:
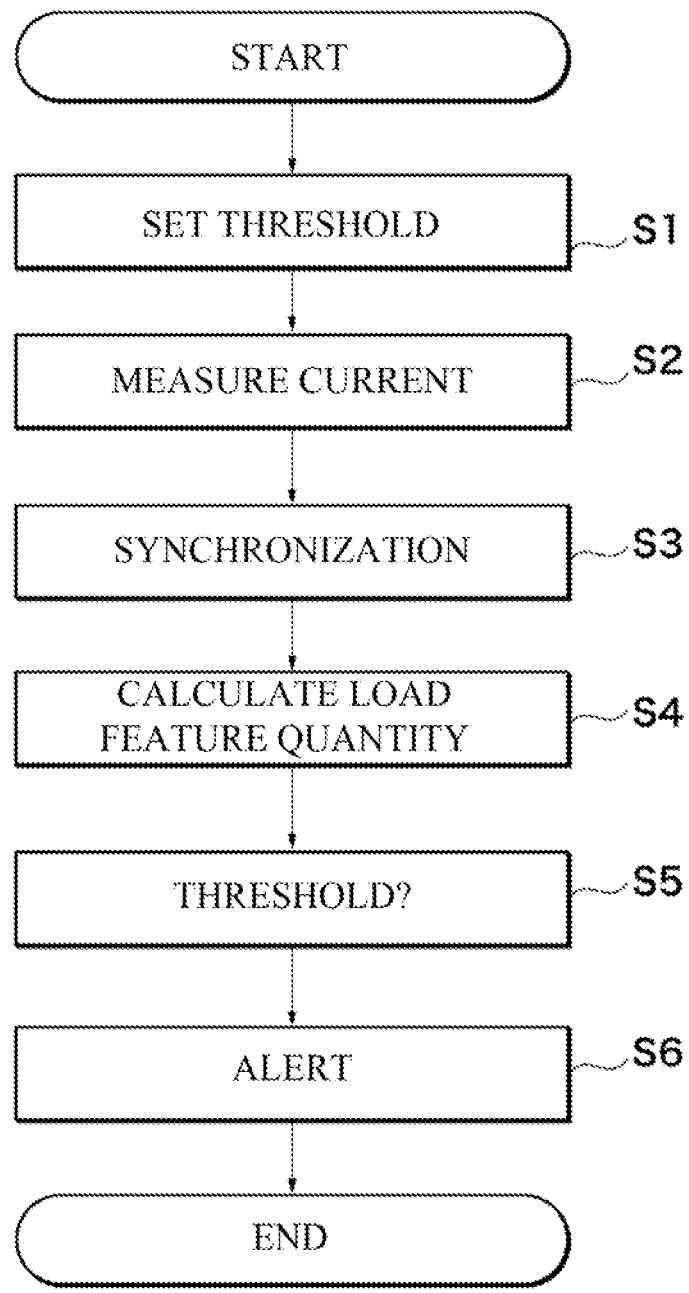
FIG. 7 is a flowchart illustrating a flow of a current measuring method for a machine tool according to a second embodiment of the present disclosure.

Next, with reference to a flowchart that is FIG. 7, a current measuring method of the machine tool 1 using the machine tool current measuring system 10 according to the embodiment of the present disclosure will be described in detail.

The basic flow is to cause the first current sensor (e.g., the current sensor 205-*a*, the current sensor 205-*b*, or the current sensor 205-*c*) to measure a current that flows through the first motor which receives load fluctuation when the workpiece 103 is processed, to cause the current sensor 205-*d* as the second current sensor to measure a current that flows through the second motor which operates for the change of the plural kinds of tools 105, and to synchronize the time-history waveforms of the respective currents that flow through the respective two motors so as to perform an analysis process.

The following description will be given of a case in which the workpiece 103 is processed by changing the two kinds of tools that are the tool 105-*a* and the tool 105-*b* utilized for a cutting work, etc., by an NC lathe which is the machine tool 1, the wear condition for each tool (providing that when the wear condition exceeds a certain limit, it becomes a state involved in a concept that is "tool abnormality") is estimated together with the load estimation on the tool, and thus the tool replacement timing is estimated and informed.

Although the description will be given of the case in which the first sensor is the current sensor 205-*a* that measures a current which flows through the main shaft motor 101, as the first current sensor, the current sensor 205-*b* that measures a current which flows through the servo motor 102-*a* and the current sensor 205-*c* that measure a current which flows through the servo motor 102-*b* may be also adoptable.

First, the threshold 403 and the threshold 404 of the load feature quantities for the respective tool 105-*a* and tool 105-*b* are set in advance in the predetermined table, etc., in the storage device of the information processing device 30 (step S1).

Next, when the machine tool 1 starts processing on the workpiece 103 using the tool 105, the current sensor 205-*a* measures a current that flows through the main shaft motor 101, and the current sensor 205-*d* measures a current that flows through the servo motor 102-*c* (step S2).

Subsequently, the information processing device 30 obtains, as illustrated in FIG. 4, the time-history waveform 301 (indicated by the continuous line) of the current that flows through the main shaft motor 101, and the time-history waveform 302 (indicated by the dashed line) of the current that flows through the servo motor 102-*c*, and performs a synchronization process (step S3).

The arithmetic processing unit of the information processing device 30 estimates that, up to an momentary peak (a peak signal) that appears first in the time-history waveform 302 from a start time point of a cutting work etc., the tool 105-*a* is utilized, the tool is changed from the tool 105-*a* to the tool 105-*b* at a time point at which the momentary peak appears first when the tool mount 106 is initially rotated, and the tool 105-*b* is utilized subsequently until the next momentary peak appears in the time history waveform 302, and calculates the load feature quantity that is the average value of the magnitudes of the current in the region that is the block 1 where the tool 105-*a* is utilized in FIG. 4 and of the magnitudes of the current in the region that is the block 2 where the tool 105-*b* is utilized (step S4). Note that by an association with the data on the sequential order of the utilization of the multiple tools set in advance in the predetermined table, etc., in the storage device of the information processing device 30, the tool change from the first tool to the second tool can be identified, and more specifically, it can be identified from which kind of tool to which kind of tool the tool is changed every time the momentary peak appears in the time-history waveform 302.

Next, the arithmetic processing unit of the information processing device 30 determines whether or not the load feature quantities of the respective tools reach the threshold 403 and the threshold 404 of the load feature quantities of the respective tools set in the above-described step S1 (step S5), estimates that the surface of the tool is worn and the deterioration is remarkable, and thus the tool replacement cycle is coming when there is a tool that is determined as reached to such threshold. The arithmetic processing unit of information processing device 30 displays a predetermined alert such that the tool wear condition is excessive and the tool replacement is necessary on, for example, as illustrated in FIG. 6, the display screen 5, etc., of the display device 40 (step S6).

Accordingly, in a state in which the plurality of workpieces 103 that is the same kind is to be processed by measuring the current of the motor that drives the rotating main shaft and the current of the motor that drives the tool mount without through the NC machine that is the machine tool 1, and by performing the synchronization process, by relatively comparing, for each workpiece, the non-negative function value of the current waveform taken out for each tool 105, and by monitoring the transition thereof, the wear condition for each tool 105 relative to the number of times of processing on the workpieces 103 can be estimated.

According to conventional technologies, although a machine tool manufacturer can analyze data from a program that is running in the machine, in a case in which, for example, a plurality of machine tools made by different manufacturers is utilized in a factory, it is desirable to determine, in a versatile scheme, the tool replacement timing, etc., from the exterior of the machine tool 1 (when a modification is made to an internal electric circuit etc., it becomes a reconstructed machine tool, and thus there is a risk such that the reconstructed machine tool becomes out from the manufacturer guarantee). When, for example, three kinds of tools are utilized to process one workpiece while changing such tools, there is a case in which a certain kind of tool is utilized for a relatively long time, thus worn out at first, but with reference to the number of rotations set by the machine tool manufacturer, those tools are collectively replaced, and there is also a case in which the abnormality value is measured and determined based on the total values of the three kinds of tools. In such cases, the other two kinds of tools are still in a utilizable condition, and thus waste costs for the tool arise. By utilizing each tool up to the limit of the utilization allowable range, and by disposing each tool and replacing to the new tool at each proper timing, the costs can be reduced and the economic efficiency can be accomplished.

According to this embodiment as described above, in a cutting work that utilizes plural kinds of tools by an NC lathe that is a machine tool, an abnormality of the tool that is being utilized is detectable.

Note that although the NC lathe described in the above description has a single main shaft, the present disclosure is also applicable to a composite lathe that has a plurality of main shafts.

Moreover, by utilizing both at least one of the current sensors 205 and a predetermined voltage sensor, a current and a voltage can be measured simultaneously, and thus the same advantageous effects as that of the above-described embodiment that utilizes the current can be accomplished based on the power consumption of the main shaft motor 101 or the servo motor 102, etc.

Next, a current measuring system for a machine tool according to a second embodiment of the present disclosure will be described in detail with reference to the figures.

It is assumed that a machining center (a vertical type machining center) is the machine tool.

Note that the duplicated description with the above-described machine tool of the first embodiment will be omitted, and the same reference numeral may be given to the same component, etc.

Figure 8:
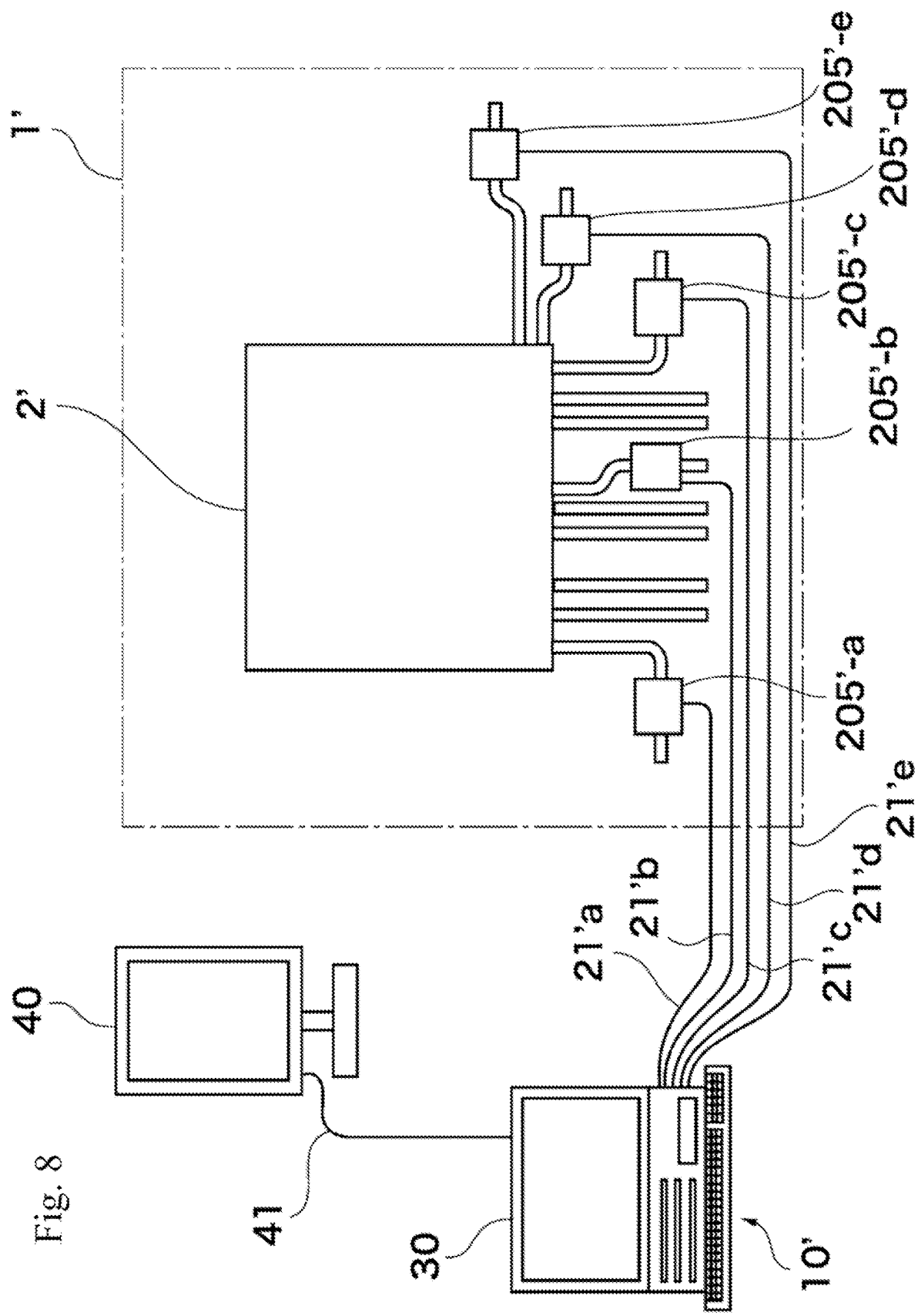
FIG. 8 is a configuration diagram of a current measuring system for a machine tool according to the second embodiment of the present disclosure.

FIG. 8 is a structural diagram of a current measuring system 10' of a machine tool 1' according to this embodiment of the present disclosure.

A current measuring system 10' includes a current sensor 205'-*a*, a current sensor 205'-*b*, a current sensor 205'-*c*, a current sensor 205'-*d*, and a current sensor 205'-*e*, a cable 21'-*a*, a cable 21'-*b*, a cable 21'-*c*, a cable 21'-*d*, and a cable 21'-*e*, the information processing device (e.g., an industrial personal computer) 30, and the display device 40.

The current sensors 205' are each, for example, a well-known magnetic current sensor, detect the magnetic fields generated by a current to be measured and around a wire by a magnetic sensor, and measure the magnitude of the magnetic fields, thereby measuring a current value (a current amount). Among the cables that run from a control board 2' of the machine tool 1', the current sensor 205'-a is attached to a cable (a wiring) connected to a main shaft motor 101' so as to measure a current that flows through the main shaft motor 101', the current sensor 205'-b is attached to a cable connected to a servo motor 102'-a so as to measure a current that flows through the servo motor 102'-a (a Z-axis servo motor for the main shaft), the current sensor 205'-c is attached to a cable connected to the servo motor 102'-b so as to measure a current that flows through the servo motor 102'-b (an X-axis servo motor that drives a stage 107'), the current sensor 205'-d is attached to a cable connected to a servo motor 102'-c so as to measure a current that flows through the servo motor 102'-c (a Y-axis servo motor that drives the stage 107'), and the current sensor 205'-e is attached to a cable connected to a servo motor 102'-d so as to measure a current that flows through the servo motor 102'-d (an ATC servo motor that drives an Automatic Tool Changer (ATC)) 108'.

Respective cables 21'-a, 21'-b, 21'-c, 21'-d, and 21'-e of the current sensors 205'-a, 205'-b, 205'-c, 205'-d and 205'-e are connected to the information processing device 30 (it may be connected wirelessly, etc.). Note that the respective cables 21' are connected to an unillustrated I/O module (that includes an analog circuit for noise elimination and signal amplification, and an AD converter that converts analog data into digital data). The I/O module may convert an analog signal input from the current sensor 205' into a digital signal, and may output the digital signal to the information processing device 30 by wired or wireless communication.

The information processing device 30 includes a CPU, etc., that is an arithmetic processing unit as a control unit and also a calculating unit, and further includes a predetermined storage device as a storing unit, such as a built-in or external HDD. Moreover, the information processing device 30 may include a built-in electronic circuit as the analog circuit.

The display device 40 includes a display mechanism and an input mechanism, and may be supported by a predetermined stand, or may be fastened to the machine tool 1' by a predetermined jig. Moreover, the display device 40 may include merely an informing function like a lamp alone. The display device 40 is connected to the information processing device 30 via a predetermined cable 41 (or may be a wireless connection, etc.). An example display device 40 is a liquid crystal display, a touch panel display, a tablet terminal, or a smart phone, etc.

Figure 9:
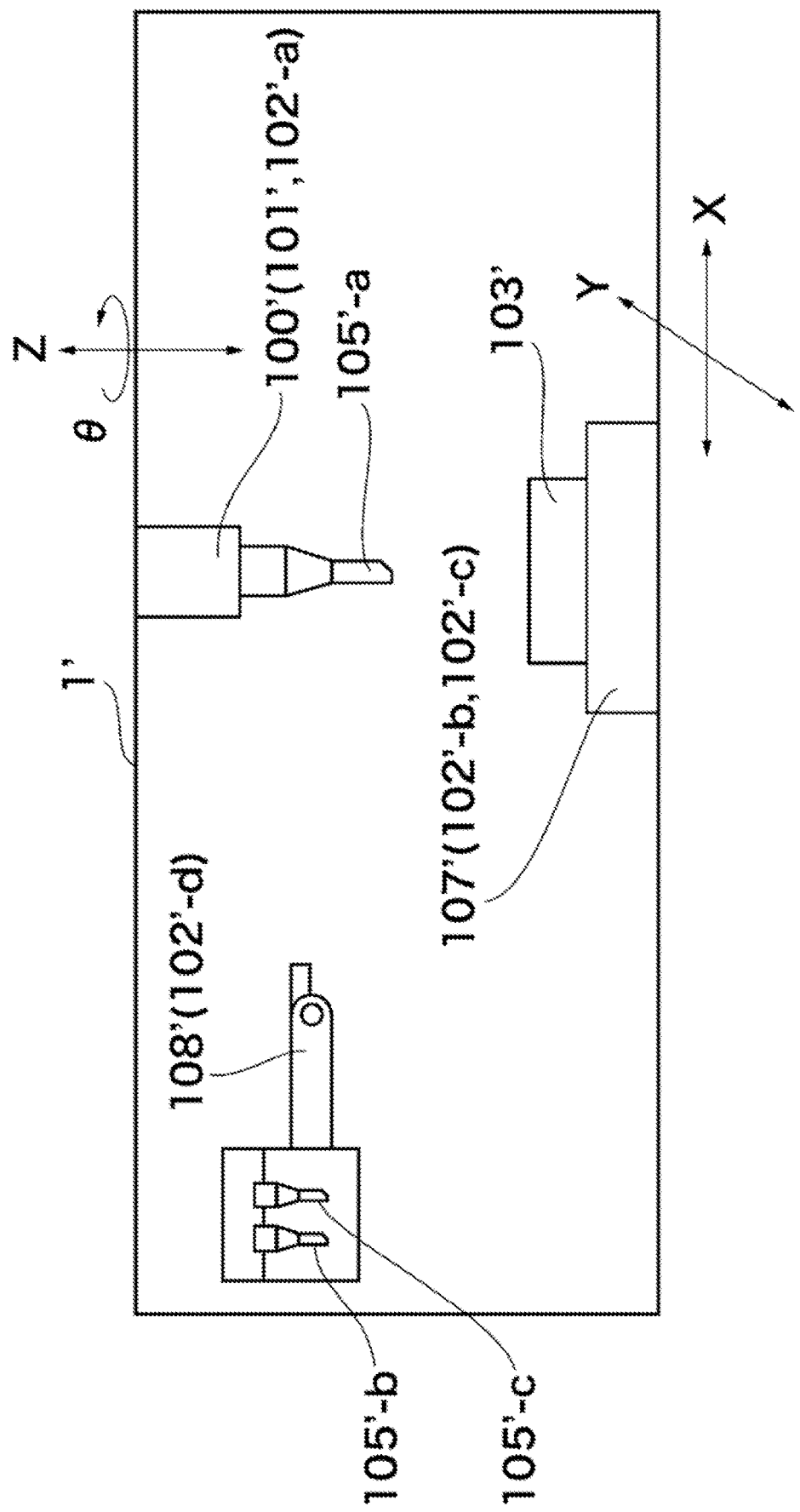
FIG. 9 is a schematic diagram of the machine tool according to the second embodiment of the present disclosure.

FIG. 9 is a schematic diagram that illustrates a conventional vertical type machining center (three-axis processing, table (stage) drive type) which is an example machine tool 1'.

Attached to the machine tool 1' are the main shaft motor 101' that drives a main shaft 100', the Z-axis servo motor 102'-a, the servo motor 102'-b and the servo motor 102'-c which drive the stage 107', and the servo motor 102'-d that drives the ATC 108'.

A workpiece 103' (e.g., a cuboid metal piece) that is an object to be processed is attached and fastened to the stage 107'. Note that the servo motor 102'-b (the X-axis servo motor) and the servo motor 102'-c (the Y-axis servo motor) which drive the stage 107' are for a horizontal movement indicated by the X-axis in FIG. 9 and for the back-and-forth movement indicated by the Y-axis in the figure, respectively. Depending on the machine tool, the degree of freedom for the movement by the servo motor 102' may further increases, and a motor for such a purpose may be added. An example is a five-axis processing to which two axes that are for rotation and for inclination are further added.

A tool 105' (in this description, 105'-a) for processing the workpiece is attached to the main shaft 100', rotates around the main shaft 100', and moves in the vertical direction indicated by the Z-axis in FIG. 9 by the servo motor 102'-a (the Z-axis servo motor) that drives the main shaft 100'.

The plural kinds of tool 105'-a, 105'-b, and 105'-c for processing the workpiece (although those are three that are a, b and c for the purpose of description, those may be equal to or greater than four) are changed by the ATC 108'. As an example, in FIG. 9, the ATC 108' is provided with the tools 105'-b and 105'-c as tools to be changed, and the servo motor 102'-d that drives the ATC is actuated in accordance with a tool change signal from an NC machine 201' based on an NC program. Hence, the ATC 108' performs a tool change from the tool 105'-a attached to the main shaft 100' to the tool 105'-b or to the tool 105'-c' (note that a "change" to a different kind of tool and a "replacement" to a (new) tool will be described as different concepts). Moreover, the position where the ATC 108' is provided (mounted) on the machine tool 1' illustrated in FIG. 9 is optional.

In FIG. 9, the main shaft 100' is moved to the lower side in the figure by the servo motor 102'-a that follows commands from the NC program, and the tool 105'-a (that is rotating around the main shaft) abuts the workpiece 103' on the stage 107'. Hence, a cutting work, etc., is performed.

The tool 105' is selected in accordance with the material of the workpiece 103' and the kind of processing, and for example, in a rough process in which a large elimination volume per a unit process time as much as possible is required, the tool 105' in a shape that has a large contact area between the tip thereof and the workpiece 103' is selected. Moreover, in a finishing process on a surface that directly relates to the process quality, the tool 105' that has a tip shape which makes the surface roughness uniform is selected. Furthermore, in an inner-diameter cutting that cuts the workpiece 103' from the internal side of the rotation shaft, the tool 105' for boring is selected.

Figure 10:
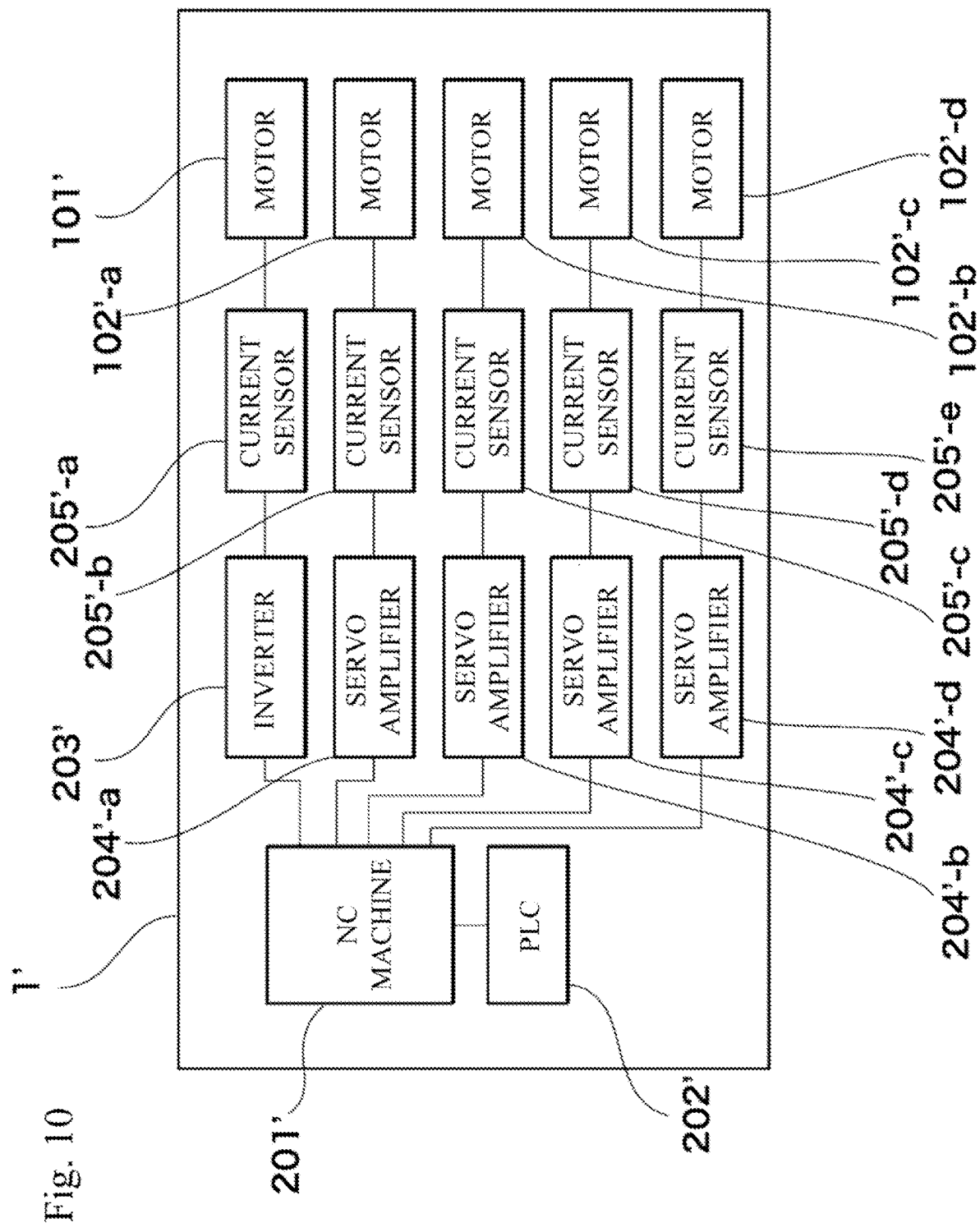
FIG. 10 is a block diagram describing a signal flow according to the second embodiment of the present disclosure.

FIG. 10 is a block diagram for describing a signal flow in the vertical type machining center that is the machine tool 1' and in the current measuring system 10' thereof.

In FIG. 10, first, a control signal output by the NC machine 201' is input to a PLC 202', an inverter 203', a servo amplifier 204'-a, a servo amplifier 204'-b, a servo amplifier 204'-c, and a servo amplifier 204'-d.

The inverter 203' drives a main shaft motor 101', and the servo amplifier 204'-a, the servo amplifier 204'-b, the servo amplifier 204'-c, and the servo amplifier 204'-d control the respective motions (operations) of a servo motor 102'-a, a servo motor 102'-b, a servo motor 102'-c, and a servo motor 102'-d in accordance with commands from the NC machine 201.

The current sensor 205'-a measures a current that flows through the main shaft motor 101', and the current sensor 205'-b, the current sensor 205'-c, the current sensor 205'-d, and the current sensor 205'-e measure respective currents that flow through the servo motor 102'-a, the servo motor 102'-b, the servo motor 102'-c, and the servo motor 102'-d.

A program (an NC program) for processing the workpiece 103' into a desired shape is loaded in advance in the NC machine 201'.

When the main shaft motor 101' rotates, the tool 105' attached thereto also rotates simultaneously.

When the servo amplifier 204'-a drives the servo motor 102'-a in accordance with commands from the NC machine

201', the main shaft 100' moves in the vertical direction indicated by the Z-axis in FIG. 9, the tool 105' contacts the workpiece 103', and thus a cutting work is performed.

When the servo amplifier 204'-b drives the servo motor 102'-b in accordance with commands from the NC machine 201', the stage 107' moves in the horizontal direction indicated by the X-axis in FIG. 9, and when the servo amplifier 204'-c drives the servo motor 102'-c in accordance with commands from the NC machine 201', the stage 107' moves in the back-and-forth direction indicated by the Y-axis in FIG. 9.

When the servo amplifier 204'-d drives the servo motor 102'-d in accordance with commands from the NC machine 201', the ATC 108' operates so as to change the tool 105'.

Figure 11:
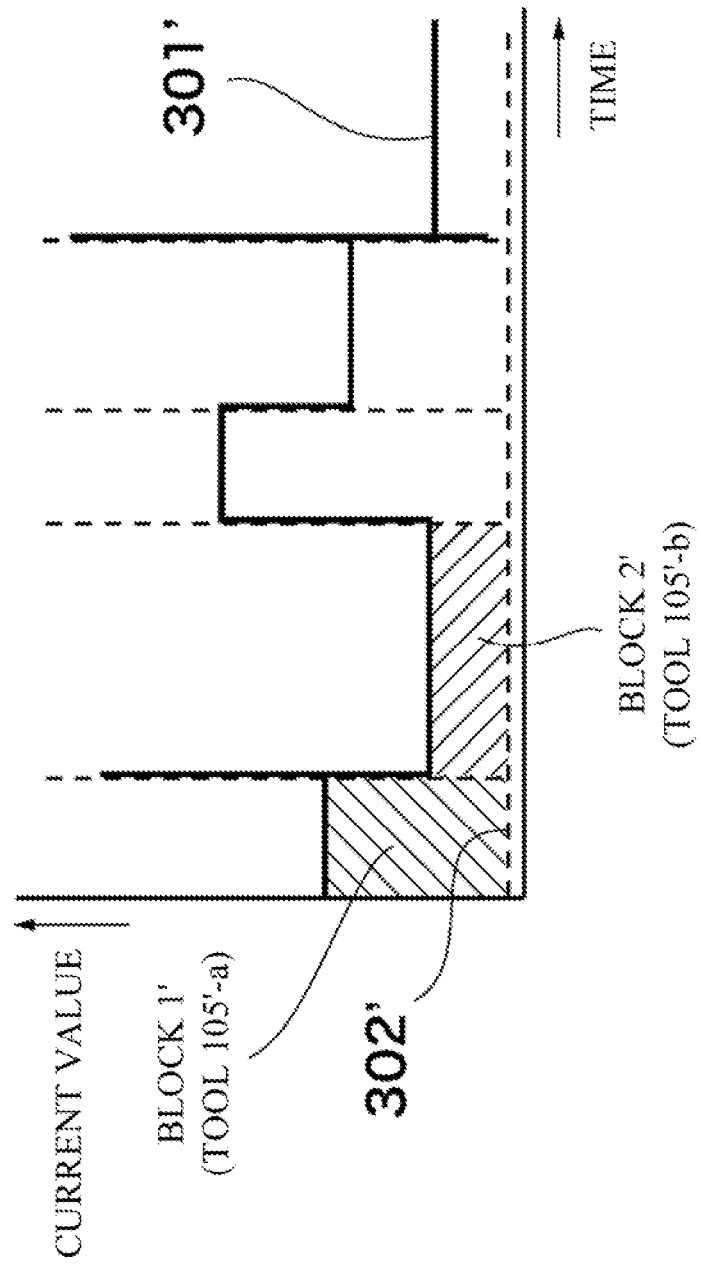
FIG. 11 is a diagram illustrating time-history waveforms of a current signal that flows through a main shaft motor and of a current signal that flows through a servo motor according to the second embodiment of the present disclosure.

FIG. 11 illustrates a time-history waveform 301' (indicated by a continuous line) of a current which is measured by the current sensor 205', and which flows through the main shaft motor 101' while the vertical type machining center that is the machine tool 1' is operating, and a time-history waveform 302' (indicated by a dashed line) of a current which is measured by the current sensor 205'-e, and which flows through the servo motor 102'-d while the machine tool 1' is operating. Note that the vertical axis represents a current value and the horizontal axis represents an elapsed time. In this embodiment, although an example case will be described in which the current sensor 205'-a that measures a current which flows through the main shaft motor 101' is the first current sensor, as the first current sensor, the current sensor 205'-b that measures a current which flows through the servo motor 102'-a, or the current sensor 205'-c that measures a current which flows through the servo motor 102'-b can be also applied. The duplicated description will be omitted (note that in the description with reference to FIG. 12 and FIG. 13 to be described later, the description in a case in which the current sensor 205'-b or the current sensor 205'-c is applied will be substantially duplicated, thus being omitted).

When the tool utilized for a cutting work, etc. is changed to, for example, the tool 105'-b from the tool 105'-a, the ATC 108' is actuated. At this time, since a large current to actuate the ATC 108' flows through the servo motor 102'-d, in time-history waveform 302' of the current that flows through the servo motor 102'-d, a momentary peak (including a short-term persistence peak, the same is true of the following descriptions) appears. By synchronizing (overlapping) the time-history waveform 302' including this momentary peak with the time-history waveform 301' of the current that flows through the main shaft motor 101', the time-history waveform of the current that flows through the main shaft motor 101' in accordance with the utilization time of the tool 105'-a and the tool 105'-b can be extracted (taken out).

The measured current value is stored in the storage device, etc., of the information processing device 30, and the arithmetic processing unit of such an information processing device 30 connected to the storage device, etc., may perform the synchronization process with digital data, or the analog circuit (an electronic circuit that handles electric signals that change continuously) of the information processing device 30 may perform the synchronization process with analog information.

More specifically, as illustrated in FIG. 11, from a time point at which the cutting work, etc., is started and up to the momentary peak that appears first in the time-history waveform 302', it can be estimated that the tool 105'-a is utilized. When the ATC 108' is initially actuated, the momentary peak appears first, and it can be estimated that the tool is changed to the tool 105'-b from the tool 105'-a at this time point.

Subsequently, until the next momentary peak appears in the time-history waveform 302', it can be estimated that the tool 105'-b is being utilized. However, FIG. 11 merely illustrates an example graph to facilitate understanding to the present disclosure, a state until the tool 105'-a contacts the workpiece 103' from the time point at which the cutting work, etc., is started, and also a state in which no tool 105' is contacting the workpiece 103' when the tool is changed from the tool 105'-a to the tool 105'-b are ignored and not illustrated. Moreover, the current value does not always take a constant (flat) value for each tool.

Note that when the cutting work, etc., is performed, by an association with data which is on the sequential order of the plurality of tools to be utilized and which is set in advance in a predetermined table, etc., of the storage device of the information processing device 30, every time the momentary peak appears in the time-history waveform 302', a change from the first utilized tool to the second utilized tool can be identified, and it is also specifically identifiable from what kind of tool the tools are changed. The data on the sequential order of the plurality of tools to be utilized may be obtained from the information processing device 30, and such data may be associated with the data illustrated in FIG. 11, and the display device 40 may display a tool name specifically indicating at what time slot the tool is utilized and the kind of such a tool.

Moreover, although in FIG. 11, the description has been given of an example case in which the "vertical type machining center" that employs a predetermined structure is the machine tool 1', the specific structure of the machine tool 1' is not limited to any particular structure as far as it processes the workpiece 103' while changing the plural kinds of tools 105', and includes the first motor that receives load fluctuation when the workpiece 103' is processed, and the second motor for an operation to change the plural kinds of tools 105'. The first current sensor (e.g., the current sensor 205'-a, the current sensor 205'-b, the current sensor 205'-c, or the current sensor 205'-d) measures a current that flows through the first motor which receives load fluctuation when the workpiece 103' is processed, the second current sensor that is the current sensor 205'-e measures a current that flows through the second motor for an operation to change the plural kinds of tools 105', and by synchronizing the respective time-history waveforms of the currents which flow through the two motors, an analysis process can be performed (the same is true of the following description with reference to FIG. 12 and FIG. 13 to be described later).

Furthermore, in addition to the estimation for the timing of replacing the tool 105', since large currents flow through the servo motor 102'-a, the servo motor 102'-b and the servo motor 102'-c when the main shaft 100' is moved vertically and when the stage 107' is moved horizontally and back and forth, the operating hour and operating rate, etc., of the machine tool 1' can be estimated based on such vertical, horizontal and back-and-forth movements.

Still further, it can be also applicable for malfunction prediction (an abnormality detection). That is, the first current sensor that is the current sensor 205'-a measures a current which flows through the first motor that receives the load fluctuation when the workpiece 103' is processed, the second current sensor that is the current sensor 205'-e measures a current which flows through the second motor for an operation to change the plural kinds of tools 105', and the respective time-history waveforms of the currents which flow through the two motors are synchronized to perform the analysis process. When a different waveform from a normal (normally operating time) waveform appears, it is estimated that this is a sign of the malfunction of the machine tool 1' or the tool 105', or, the machine tool or the tool is malfunction. This enables the malfunction prediction.

Figure 12A:
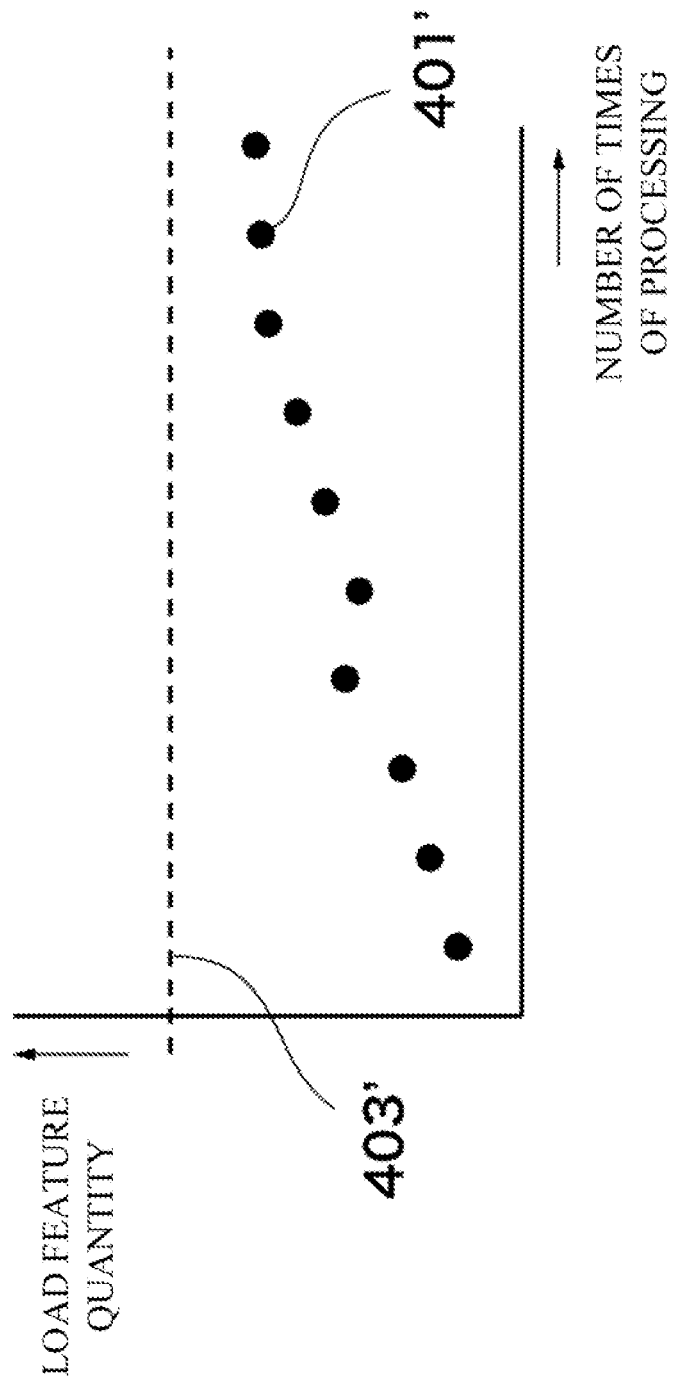
FIGS. 12A and 12B are each a diagram for describing a transition in load feature quantity for each kind of tools according to the second embodiment of the present disclosure.
Figure 12B:
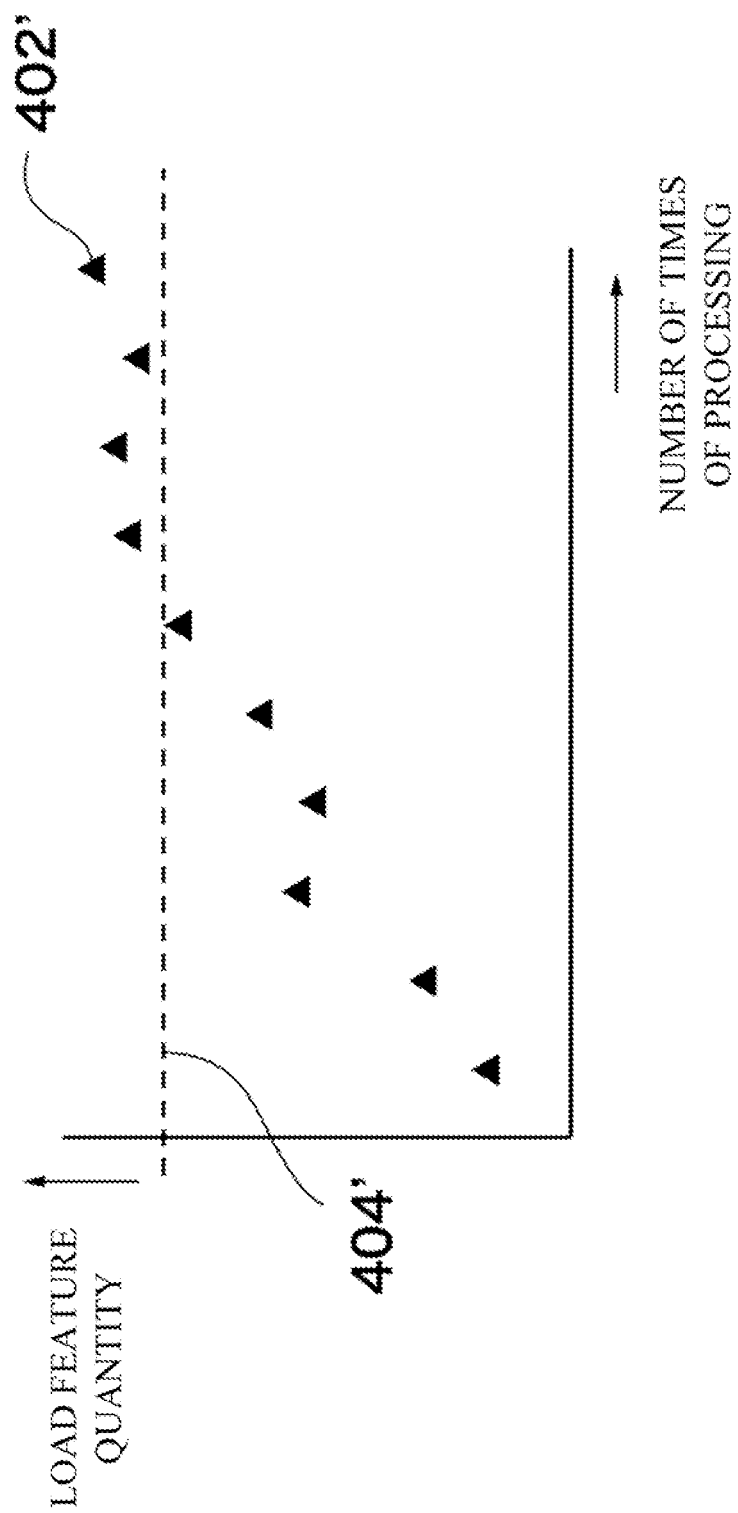

FIG. 12A and FIG. 12B illustrate transitions in a load feature quantity (note that the term "load" in this example means the magnitude of repulsive force when a tool is caused to contact the workpiece; there are various calculation formulae and indices, but in the following description, it is assumed that the load is estimated by measuring the "magnitude of the current", i.e., when relatively large load is applied (e.g., a an inferior tool contacts the workpiece, and resistance by what corresponds to such a contact occurs), a relatively large current flows, and when relatively small load is applied (e.g., not an inferior tool contacts the workpiece, and resistance by what corresponds to such a contact occurs), a relatively small current flows, and when no load is applied (idling), substantially no current flows, and such events are utilized for estimation) for each kind of the tool relative to the number of times of processing (may be a processing time or an eliminating volume, etc.).

In this embodiment, the term load feature quantity means the average value of a current value at each block in FIG. 11. More specifically, in FIG. 11, the magnitude of a current at a time at which the tool 105'-a is utilized is indicated as a region (a taken-out segment) in a block 1', and the average value of the magnitudes of the current at such a time slot is plotted as a circle in FIG. 12A as the load feature quantity. Similarly, in FIG. 11, the magnitude of a current at a time at which the tool 105'-b is utilized is indicated as a region (a taken-out segment) in a block 2', and the average value of the magnitudes of the current at such a time slot is plotted as a triangle in FIG. 12B as the load feature quantity. Note that the circle and the triangle plotted in FIGS. 12A and 12B are respective load feature quantities calculated by the arithmetic processing unit of the information processing device 30 based on a presumption such that the same workpieces are processed at the same conditions, such as a case in which the same products are produced by 100, and are indicated by graphs in order to facilitate understanding. Hence, making a graph is not essential.

In accordance with the increase in the number of times of processing, a load feature quantity 401' of the tool 105'-a illustrated in FIG. 12A and a load feature quantity 402' of the tool 105'-b illustrated in FIG. 12B both show an increase tendency (since there may be an error in measurement, etc., it is not always true that the load feature quantity increases in proportion to the number of times of processing).

This is because, when the surface of the tool is worn out and is deteriorated in accordance with the increase in the number of times of processing, i.e., the number of times of utilization of the tool, the friction of the surface of the tool that contacts the workpiece increases, i.e., a resistance increases and thus a load increases.

When it is determined that the load feature quantities of the respective tools calculated by the arithmetic processing unit of the information processing device 30 reach threshold 403 and threshold 404, respectively, of the respective load feature quantities of the tools set in advance in a predetermined table, etc., in the storage device of the information processing device 30 (any measurement error countermeasure such as to determine whether or not such feature quantity reaches continuously twice even if it has reached once, and an additional condition such that it reaches continuously twice to a pre-threshold that is roughly 90 percentage may be added), it is estimated that the surface of the tool is worn out and the deterioration is remarkable, and thus the tool replacement cycle is coming, and the arithmetic processing unit of the information processing device 30 gives a predetermined alert for tool replacement on the display screen 5, etc., of the display device 40.

Note that although a non-negative function (a mean square value) that has the current value at each taken-out segment as a parameter is relatively compared for each number of times of processing of the object to be processed in the above case, the total value of the absolute values of the current values measured as the non-negative function values may be utilized.

Furthermore, when a theoretical lifetime curve (that indicates the progress of wear of the tool 105' under an ideal condition in which no variable due to disturbance, etc., occurs on a cutting work) is indicated in FIGS. 12A and 12B, based on the relation between the plotted load feature quantity and the theoretical lifetime curve (e.g., a transition, a tendency of inclination), the progress of wear of the tool 105' at the time of observation can be estimated by various conventional techniques. When, for example, the theoretical lifetime curve is substantially S-shape, a timing at which it comes to the second curve may be defined in advance as a tool replacement cycle, and when the information processing device 30 determines that it comes to the second curve based on the transition of the plotted load feature quantities, a predetermined alert for tool replacement may be given to the display screen 5, etc., of the display device 40.

Moreover, depending on the conditions, etc., of the processing, regarding the predetermined tool 105', since the sensitivity is low (e.g., the correspondence between the worn-out level of the tool and the change in current value is not excellent) for the current that flows through the main shaft motor 101' which is the first motor that receives load fluctuation when the workpiece 103' is processed, there may be a possibility such that it is difficult to effectively and efficiently estimate the progress of the wear of the tool. In such a case, the estimation may be possible from the current that flows through the other servo motor 102'. Accordingly, the presence of the plurality of candidates as the first current sensor (e.g., the current sensor 205'-a, the current sensor 205'-b, the current sensor 205'-c and the current sensor 205'-e) has a remarkable advantage in this point.

Figure 13:
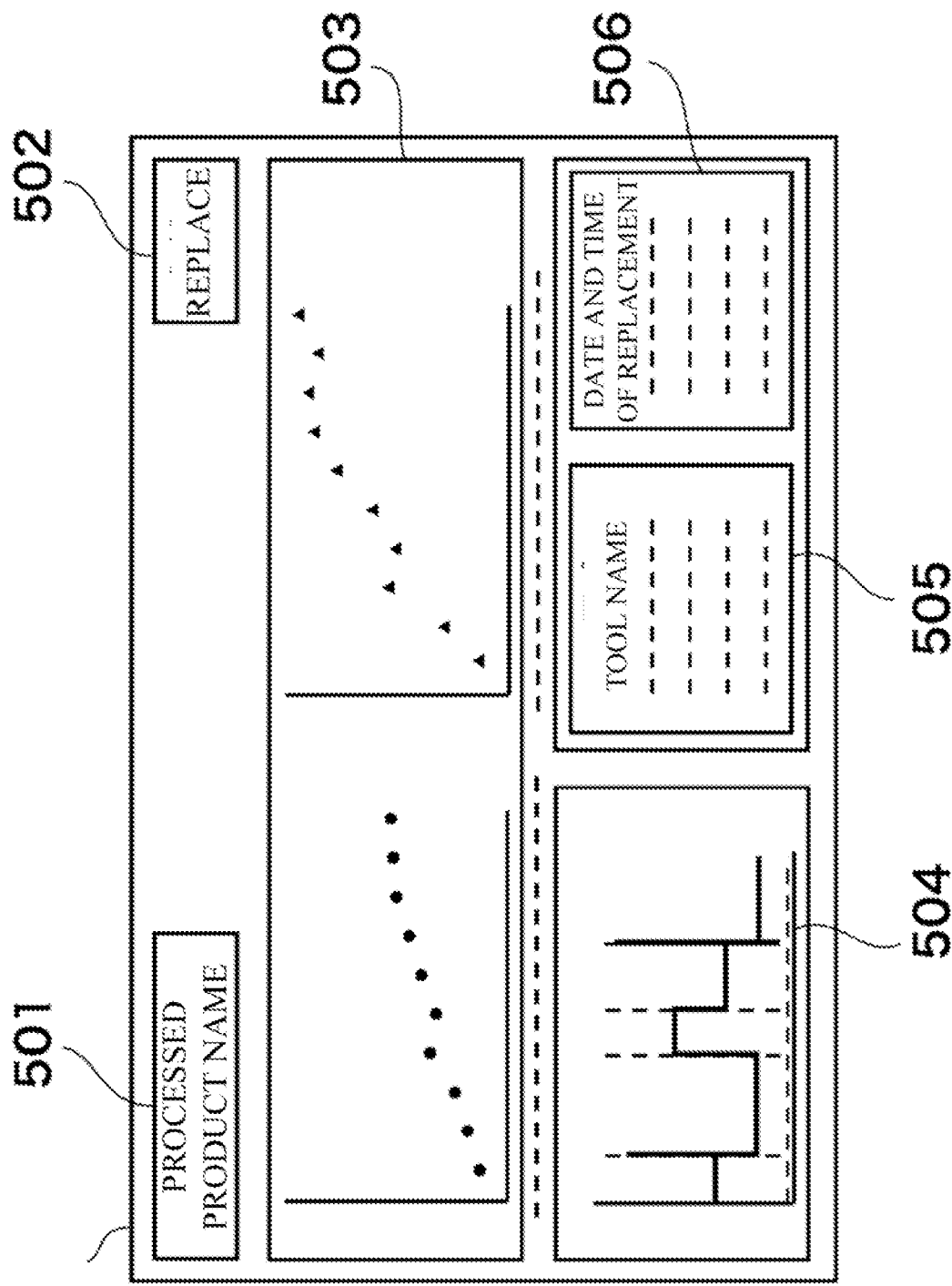
FIG. 13 is a diagram illustrating an example display screen on a display device according to the second embodiment of the present disclosure.

FIG. 13 illustrates an example display screen 5 displayed on the display device 40.

The display screen 5 includes a display 501 for a processed product name (e.g., product name: cam shaft for a vehicle of company A), a display 502 for a tool replacement notification (an alert), a display 503 for the tool load feature quantity, a display 504 for a current measured value (the time-history waveform of the current and the current value at the present time may be also displayed), a display 505 for the name of a tool, and a display 506 for a tool replacement record (e.g., the date and time of replacement) as past record information, etc. Needless to say, it is not necessary to display all of those.

Note that instead of an output on the display screen 5, a predetermined individual lamp, etc., may be turned on so as to give an alert for the tool replacement only.

Moreover, the data output to display device 40, etc., may be displayed only on a predetermined display unit (a liquid crystal display, etc.,) of the information processing device 30 so as to be utilized without being output to display device 40, etc.

Figure 14:
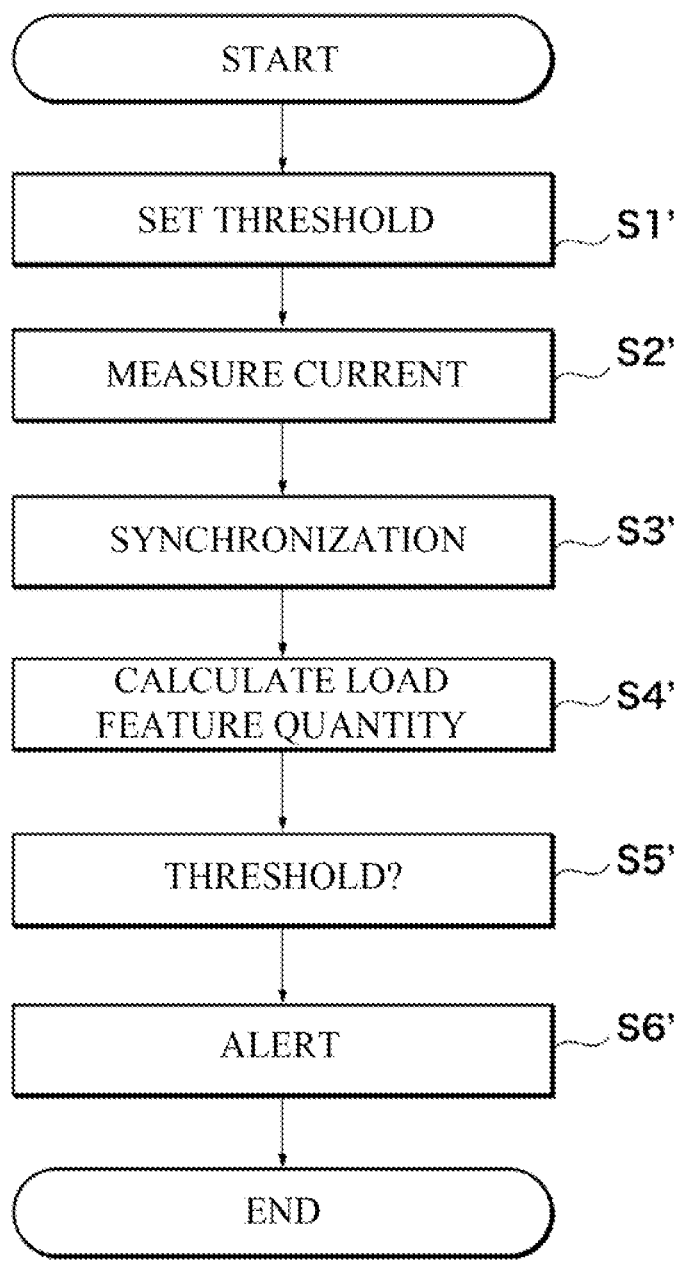
FIG. 14 is a flowchart illustrating a flow of the current measuring method for the machine tool according to the second embodiment of the present disclosure.

Next, with reference to a flowchart that is FIG. 14, a current measuring method of the machine tool 1' using the machine tool current measuring system 10 according to the embodiment of the present disclosure will be described in detail.

The basic flow is to cause the first current sensor (e.g., the current sensor 205'-a, the current sensor 205'-b, or the current sensor 205'-c or the current sensor 205'-d) to measure a current that flows through the first motor which receives load fluctuation when the workpiece 103' is processed, to cause the current sensor 205'-e as the second current sensor to measure a current that flows through the second motor which operates for the change of the plural kinds of tools 105', and to synchronize the time-history waveforms of the respective currents that flow through the respective two motors so as to perform an analysis process.

The following description will be given of a case in which the workpiece 103' is processed by changing the two kinds of tools that are the tool 105-a and the tool 105-b utilized for a cutting work, etc., by a vertical type machining center which is the machine tool 1', the wear condition for each tool (providing that when the wear condition exceeds a certain limit, it becomes a state involved in a concept that is "tool abnormality) is estimated together with the load estimation on the tool, and thus the tool replacement timing is estimated and informed.

Although the description will be given of the case in which the first sensor is the current sensor 205'-a that measures a current which flows through the main shaft motor 101', as the first current sensor, the current sensor 205'-b that measures a current which flows through the servo motor 102'-a, the current sensor 205'-c that measure a current which flows through the servo motor 102'-b and the current sensor 205'-d that measures a current which flows through the servo motor 102'-c may be also adoptable.

First, the threshold 403' and the threshold 404' of the load feature quantities for the respective tool 105'-a and tool 105'-b are set in advance in the predetermined table, etc., in the storage device of the information processing device 30 (step S1').

Next, when the machine tool 1' starts processing on the workpiece 103' using the tool 105', the current sensor 205'-a measures a current that flows through the main shaft motor 101', and the current sensor 205'-e measures a current that flows through the servo motor 102'-d (step S2').

Subsequently, the information processing device 30 obtains, as illustrated in FIG. 11, the time-history waveform 301' (indicated by the continuous line) of the current that flows through the main shaft motor 101', and the time-history waveform 302' (indicated by the dashed line) of the current that flows through the servo motor 102'-d, and performs a synchronization process (step S3').

The arithmetic processing unit of the information processing device 30 estimates that, up to an momentary peak (a peak signal) that appears first in the time-history waveform 302' from a start time point of a cutting work etc., the tool 105'-a is utilized, the tool is changed from the tool 105'-a to the tool 105'-b at a time point at which the momentary peak appears first when the ATC 108' is initially operated, and the tool 105'-b is utilized subsequently until the next momentary peak appears in the time history waveform 302', and calculates the load feature quantity that is the average value of the magnitudes of the current in the region that is the block 1' where the tool 105'-a is utilized in FIG. 11 and of the magnitudes of the current in the region that is the block 2' where the tool 105'-b is utilized (step S4'). Note that by an association with the data on the sequential order of the utilization of the multiple tools set in advance in the predetermined table, etc., in the storage device of the information processing device 30, the tool change from the first tool to the second tool can be identified, and more specifically, it can be identified from which kind of tool to which kind of tool the tool is changed every time the momentary peak appears in the time-history waveform 302'.

Next, the arithmetic processing unit of the information processing device 30 determines whether or not the load feature quantities of the respective tools reach the threshold 403 and the threshold 404 of the load feature quantities of the respective tools set in the above-described step S1' (step S5'), estimates that the surface of the tool is worn and the deterioration is remarkable, and thus the tool replacement cycle is coming when there is a tool that is determined as reached to such threshold. The arithmetic processing unit of information processing device 30 displays a predetermined alert such that the tool wear condition is excessive and the tool replacement is necessary on, for example, as illustrated in FIG. 13, the display screen 5, etc., of the display device 40 (step S6').

Accordingly, in a state in which the plurality of workpieces 103' that is the same kind is to be processed by measuring the current of the motor that drives the rotating main shaft and the current of the motor that drives the ATC without through the vertical type machining center that is the machine tool 1', and by performing the synchronization process, by relatively comparing, for each workpiece 103', the non-negative function value of the current waveform taken out for each tool 105', and by monitoring the transition thereof, the wear condition for each tool 105' relative to the number of times of processing on the workpieces 103' can be estimated.

According to conventional technologies, although a machine tool manufacturer can analyze data from a program that is running in the machine, in a case in which, for example, a plurality of machine tools made by different manufacturers is utilized in a factory, it is desirable to determine, in a versatile scheme, the tool replacement timing, etc., from the exterior of the machine tool 1 (when a modification is made to an internal electric circuit etc., it becomes a reconstructed machine tool, and thus there is a risk such that the reconstructed machine tool becomes out from the manufacturer guarantee). When, for example, three kinds of tools are utilized to process one workpiece while changing such tools, there is a case in which a certain kind of tool is utilized for a relatively long time, thus worn out at first, but with reference to the number of rotations set by the machine tool manufacturer, those tools are collectively replaced, and there is also a case in which the abnormality value is measured and determined based on the total values of the three kinds of tools. In such cases, the other two kinds of tools are still in a utilizable condition, and thus waste costs for the tool arise. By utilizing each tool up to the limit of the utilization allowable range, and by disposing each tool and replacing to the new tool at each proper timing, the costs can be reduced and the economic efficiency can be accomplished.

According to this embodiment as described above, in a cutting work that utilizes plural kinds of tools by a vertical type machining center that is a machine tool, an abnormality of the tool that is being utilized is detectable.

Moreover, by utilizing both at least one of the current sensors 205' and a predetermined voltage sensor, a current and a voltage can be measured simultaneously, and thus the same advantageous effects as those of the above-described embodiment that utilizes the current can be accomplished based on the power consumption of the main shaft motor 101' or the servo motor 102', etc.

Note that although examples are not disclosed one by one, various modifications can be made to carry out the present disclosure without departing from the scope of the present disclosure. For example, the present disclosure is also applicable to a multifunction machine tool like an NC lathe provided with functions of a machining center.

What is claimed is:

1. A current measuring system for a machine tool, the current measuring system comprising a first current sensor and a second current sensor each connected to an information processing device,
   wherein the machine tool that processes a workpiece while changing plural kinds of tools comprises:
   a first motor that receives load fluctuation when the workpiece is processed; and
   a second motor that operates to change a tool to a different kind of tool, and
   wherein the information processing device performs a process of overlapping a time-history waveform of a current which flows through the first motor and which is measured by the first current sensor with a time-history waveform of a current which flows through the second motor and which is measured by the second current sensor in such a way that respective elapsed times match with each other, identifies a changing operation of the plural kinds of tools from the current which flows through the second motor and which is measured by the second current sensor to determine a segment where each of the plural kinds of tools is used, takes out the current of the first motor measured by the first current sensor for the segment where each of the plural kinds of tools is used, and relatively compares a non-negative function value that has a current value at each taken-out segment as a parameter for each number of times of processing on the workpiece, thereby detecting a tool abnormality for each kind of the tool.

2. The machine-tool current measuring system according to claim 1, wherein the first motor is to drive a positioning device of the workpiece.

3. The machine-tool current measuring system according to claim 1, wherein the first motor is to drive a member when a position of the member to which the tool is attached is changed.

4. The machine-tool current measuring system according to claim 1, wherein the first motor is to rotate and drive the tool around a main shaft.

5. The machine-tool current measuring system according to claim 1, wherein the information processing device outputs, to a predetermined device, information on the tool abnormality.

6. A current measuring method for a machine tool which comprises a first motor that receives load fluctuation when a workpiece is processed, and a second motor that operates to change a tool to a different kind of tool and which processes the workpiece while changing plural kinds of tools, the current measuring method comprising:
   causing an information processing device to which a first current sensor and a second current sensor are connected to perform a process of overlapping a time-history waveform of a current which flows through the first motor and which is measured by the first current sensor with a time-history waveform of a current which flows through the second motor and which is measured by the second current sensor in such a way that respective elapsed times match with each other;
   causing the information processing device to perform a process of identifying a changing operation of the plural kinds of tools from the current which flows through the second motor and which is measured by the second current sensor to determine a segment where each of the plural kinds of tools is used; and
   causing the information processing device to perform a process of taking out the current of the first motor measured by the first current sensor for the segment where each of the plural kinds of tools is used, and relatively comparing a non-negative function value that has a current value at each taken-out segment as a parameter for each number of times of processing on the workpiece, thereby detecting a tool abnormality for each kind of the tool.

\* \* \* \* \*